US008577529B2

(12) United States Patent
Takahashi et al.

(10) Patent No.: US 8,577,529 B2
(45) Date of Patent: Nov. 5, 2013

(54) CONTROL APPARATUS FOR VEHICLE

(75) Inventors: Kenji Takahashi, Toyota (JP); Yuji Nishi, Nagoya (JP); Shuji Tomura, Nagoya (JP); Takeshi Takemoto, Nagoya (JP); Nobuyasu Haga, Seto (JP); Tetsuya Fuchimoto, Nagoya (JP); Tetsuya Sugimoto, Chiryu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 2931 days.

(21) Appl. No.: 13/258,635

(22) PCT Filed: Jun. 1, 2010

(86) PCT No.: PCT/IB2010/001312
§ 371 (c)(1),
(2), (4) Date: Sep. 22, 2011

(87) PCT Pub. No.: WO2010/140044
PCT Pub. Date: Dec. 9, 2010

(65) Prior Publication Data
US 2012/0065824 A1 Mar. 15, 2012

(30) Foreign Application Priority Data
Jun. 2, 2009 (JP) .................................. 2009-133110

(51) Int. Cl.
*G03F 7/00* (2006.01)
(52) U.S. Cl.
USPC ........................................................... 701/22
(58) Field of Classification Search
USPC .......................................... 701/22, 36, 63, 99
See application file for complete search history.

(56) References Cited

U.S. PATENT DOCUMENTS

| 6,285,163 | B1 * | 9/2001 | Watanabe et al. | 320/132 |
| 2008/0074082 | A1 * | 3/2008 | Tae et al. | 320/136 |
| 2009/0248334 | A1 * | 10/2009 | Sans et al. | 702/63 |

FOREIGN PATENT DOCUMENTS

| EP | 1 195 836 A2 | 4/2002 |
| EP | 1 897 772 A | 3/2008 |
| JP | 10-51906 | 2/1998 |
| JP | 11-174134 | 7/1999 |
| JP | 2000-166109 | 6/2000 |
| JP | 2002-117833 | 4/2002 |
| JP | 2003-149307 | 5/2003 |
| JP | 2005-302300 | 10/2005 |
| JP | 2007-220658 | 8/2007 |
| JP | 2008-241246 | 10/2008 |
| WO | WO 2004/068157 A1 | 8/2004 |

OTHER PUBLICATIONS

S.J. Lee et al., "The State and Parameter Estimation of an Li-Ion Battery Using a New OCV-SOC Concept," Power Electronics Specialists Conference (IEEE), pp. 2799-2803 (Jun. 17, 2007).

(Continued)

*Primary Examiner* — Kim T Nguyen
(74) *Attorney, Agent, or Firm* — Finnegan, Henderson, Farabow, Garrett & Dunner, LLP

(57) ABSTRACT

A control apparatus (30) estimates a status of charge (SOC) by a first estimation method by temporarily changing the SOC of a battery (B) so that the SOC of the battery (B) falls within a first region in the case a period, during which the estimated value of the status of charge of the battery (B) falls within a second region, exceeds a prescribed period.

9 Claims, 15 Drawing Sheets

(56) References Cited

OTHER PUBLICATIONS

International Search Report in International Application No. PCT/IB2010/001312; Mailing Date: Sep. 16, 2010.

Written Opinion of the International Searching Authority in International Application No. PCT/IB2010/001312; Mailing Date: Sep. 16, 2010.

* cited by examiner

OLIVINE IRON BATTERY

CONTROL APPARATUS FOR VEHICLE

CROSS-REFERENCE TO RELATED APPLICATIONS

This application is a national phase application of International Application No. PCT/IB2010/001312, filed Jun. 1, 2010, and claims the priority of Japanese Application No. 2009-133110, filed Jun. 2, 2009, the contents of both of which are incorporated herein by reference.

FIELD OF THE INVENTION

This invention relates to a control apparatus for a vehicle, and more particularly, to a control apparatus for a vehicle that includes a battery and a motor that drives by receiving electrical power from the battery.

BACKGROUND OF THE INVENTION

State of charge (to be abbreviated as SOC) detection apparatuses are available that detect a SOC (also referred to as charging rate or residual capacity) of a battery used in a vehicle. For example, many SOC detection apparatuses that detect battery SOC of an electric vehicle (EV) detect SOC by integrating battery current. Although regenerative braking can be expected to provide temporary charging in EVs, the battery is discharged for the most part during vehicle operation. The SOC is restored by charging the battery when the vehicle is not operating. Thus, there are many cases in EVs in which the SOC detection apparatus detects the SOC by integrating discharge current from the time the battery is fully charged.

Integration of battery current is also frequently used to detect battery SOC in hybrid vehicles (HV) equipped with an engine and generator. However, in HVs, charging and discharging are controlled so as to maintain battery SOC at about 50% from the viewpoints of battery service life and the acceptable amount of regenerated electrical power. Thus, there are few opportunities for the battery to become fully charged (to nearly 100%), or in other words, there are few opportunities for initializing the SOC. If detection of the battery SOC is only carried out by integrating charge and discharge current over a long period of time, current detection error is accumulated and error in the detected SOC ends up increasing.

The SOC detection apparatus described in Japanese Patent Application Publication No. 2008-241246 (JP-A-2008-241246) estimates SOC using an internal reaction model. In this SOC detection apparatus, SOC is estimated from the relationship between open circuit voltage (OCV) and SOC by utilizing the fact that the OCV of the secondary battery has a slope.

FIG. 26 is a graph that shows an SOC-OCV curve of a battery that demonstrates characteristics having a slope. With reference to FIG. 26, OCV (V) is plotted on the vertical axis and SOC (%) is plotted on the horizontal axis. For example, a lithium ion battery that uses a nickel-based or cobalt-based active material as an electrode demonstrates characteristics like those shown here. According to the characteristics shown in FIG. 26, the SOC-OCV curve has a slope, and OCV and SOC demonstrate a 1:1 relationship. Thus, SOC can be estimated by determining OCV in consideration of such factors as battery terminal voltage, battery temperature or battery current. As a result, the estimation accuracy of SOC can be improved even in cases in which there are few opportunities for the battery to become fully charged.

In recent years, olivine batteries (olivine lithium ion batteries) have attracted attention for their high level of safety and low price. Olivine batteries are a type of lithium ion battery, and this combined with the anode to create a region where the battery voltage is flat (plateau region). A material such as carbon is used for the anode. Since olivine batteries offer lower costs and higher safety than cobalt-based electrode materials, they have attracted attention in recent years as large-scale batteries in the manner of electricity storage devices used in EVs and PHVs. This type of olivine battery is disclosed in, for example, Japanese Patent Application Publication No. 2002-117833 (JP-A-2002-117833) and Japanese Patent Application Publication No. 2005-302300 (JP-A-2005-302300).

However, olivine batteries have a long plateau region (region in which OCV remains roughly constant even though SOC changes), thus making it extremely difficult to estimate SOC from values of OCV.

FIG. 27 is a graph that shows an SOC-OCV curve of an olivine battery. With reference to FIG. 27, OCV (V) is plotted on the vertical axis and SOC (%) is plotted on the horizontal axis. As shown in FIG. 27, since a lithium ion battery that uses an olivine active material as an electrode has a long plateau region, it is extremely difficult to estimate SOC from values of OCV. For example, in an example of a battery that uses a carbon-based material for the anode, there are cases in which the plateau region covers a range of SOC values of 30% to 95%.

SUMMARY OF THE INVENTION

This invention provides a control apparatus for a vehicle capable of controlling the vehicle by estimating the SOC of a battery having a long plateau region with high accuracy.

A first aspect of the invention relates to a control apparatus for a vehicle. The vehicle includes a battery and a motor that drives by receiving electrical power from the battery. Characteristics of changes in OCV relative to the status of charge of the battery include a first region in which the amount of change in the OCV relative to the amount of change in the status of charge exceeds a threshold value, and a second region in which the amount of change in the OCV relative to the amount of change in the status of charge does not exceed the threshold value. In the case an estimated value of the status of charge of the battery falls within the first region, the control apparatus updates the estimated value of the status of charge of the battery by estimating the status of charge according to a first estimation method that uses the voltage of the battery, and in the case an estimated value of the status of charge of the battery falls within the second region, the control apparatus updates the estimated value of the status of charge of the battery by estimating the status of charge according to a second estimation method that uses current input and output to and from the battery. In the case a period, during which the estimated value of the status of charge of the battery falls within the second region, exceeds a prescribed period, the control apparatus temporarily changes the status of charge of the battery so that status of charge of the battery falls within the first region and estimates the status of charge by the first estimation method.

The control apparatus may also set the threshold value based on whether or not the status of charge of the battery can be uniquely determined relative to the OCV.

Estimation accuracy of the status of charge obtained according to the first estimation method may be higher than the estimation accuracy of the status of charge obtained according to the second estimation method.

The battery may include a plurality of cells and an equalization circuit that equalizes the status of charge of the plurality of cells. The control apparatus may temporarily change the status of charge of the battery so that the status of charge of the battery falls within the first region prior to equalizing the status of charge of the plurality of cells by activating the equalization circuit and estimate the status of charge by the first estimation method.

The vehicle may further include an internal combustion engine and a generator that generates electricity by using motive power of the internal combustion engine. The control apparatus may change the status of charge of the battery by changing the amount of electrical power consumed by the motor and the amount of electricity generated by the generator.

The first region is a region in which the status of charge is lower than that of the second region, and the battery may be charged by the generator after having, discharged the battery until the status of charge of the battery reaches the first region and estimated the status of charge of the battery according to the first estimation method.

The vehicle may be configured so as to allow external charging in which the battery is charged by receiving electrical power provided from outside the vehicle. The first region may be a region in which the status of charge is higher than that of the second region. The control apparatus may discharge the battery by a prescribed amount after having externally charged the battery until the status of charge of the battery reaches the first region and estimated the status of charge of the battery according to the first estimation method.

The control apparatus may also has: a battery control unit that calculates an estimated value of the status of charge of the battery in use of either the first or second estimation method, and outputs a control target value of the status of charge based on the estimated value of the status of charge of the battery, and a hybrid control unit that changes the status of the charge of the battery by controlling the motor and the generator based on the estimated value of the status of charge of the battery and the control target value.

A second aspect of the invention relates to a control apparatus for a vehicle includes a battery and a motor. The battery has, as characteristics of changes in OCV relative to the status of charge of the battery, a first region in which the amount of change in the OCV relative to the amount of change in the status of charge exceeds a threshold value and a second region in which the amount of change in the OCV relative to the amount of change in the status of charge does not exceed a threshold value. The motor drives by receiving electrical power from the battery. The control apparatus for a vehicle is provided with a charge status estimation unit that estimates the status of charge of the battery; a first estimation unit that updates the estimated value of the status of charge of the battery by estimating the status of charge according to a first estimation method that uses the voltage of the battery in the case the estimated value of the status of charge of the battery falls within the first region; a second estimation unit that updates the estimated value of the status of charge of the battery by estimating the status of charge of the battery according to a second estimation method that uses current that is input and output to and from the battery in the case the estimated value of the status of charge of the battery falls within the second region; and a third estimation unit that estimates the status of charge by the first estimation method by temporarily changing the status of the charge of the battery so that the status of charge of the battery falls within the first region in the case a period, during which the estimated value of the status of charge of the battery falls within the second region, exceeds a prescribed period.

A third aspect of the invention relates to a vehicle control method. The vehicle has: a battery including, as characteristics of changes in OCV relative to status of charge, a first region in which the amount of change in the OCV relative to the amount of change in the status of charge exceeds a threshold value and a second region in which the amount of change in the OCV relative to the amount of change in the status of charge does not exceed the threshold value; and a motor that drives by receiving electrical power from the battery. The vehicle control method estimates the status of charge of the battery, updates the estimated value of the status of charge of the battery by estimating the status of charge according to a first estimation method that uses the voltage of the battery in the case the estimated value of the status of charge of the battery falls within the first region, updates the estimated value of the status of charge of the battery by estimating the status of charge of the battery according to a second estimation method that uses current that is input and output to and from the battery in the case the estimated value of the status of charge of the battery falls within the second region, and estimates the status of charge by the first estimation method by temporarily changing the status of the charge of the battery so that the status of charge of the battery falls within the first region in the case a period, during which the estimated value of the status of charge of the battery falls within the second region exceeds a prescribed period.

According to the control apparatus and control method as claimed in the aspects of the invention, a vehicle can be operated while estimating the SOC at high accuracy even in the case of using a battery having a long plateau region (such as an olivine battery).

BRIEF DESCRIPTION OF THE DRAWINGS

The foregoing and further features and advantages of the invention will become apparent from the following description of preferred embodiments with reference to the accompanying drawings, wherein like numerals are used to represent like elements and wherein.

DETAILED DESCRIPTION OF EMBODIMENTS

Figure 1:
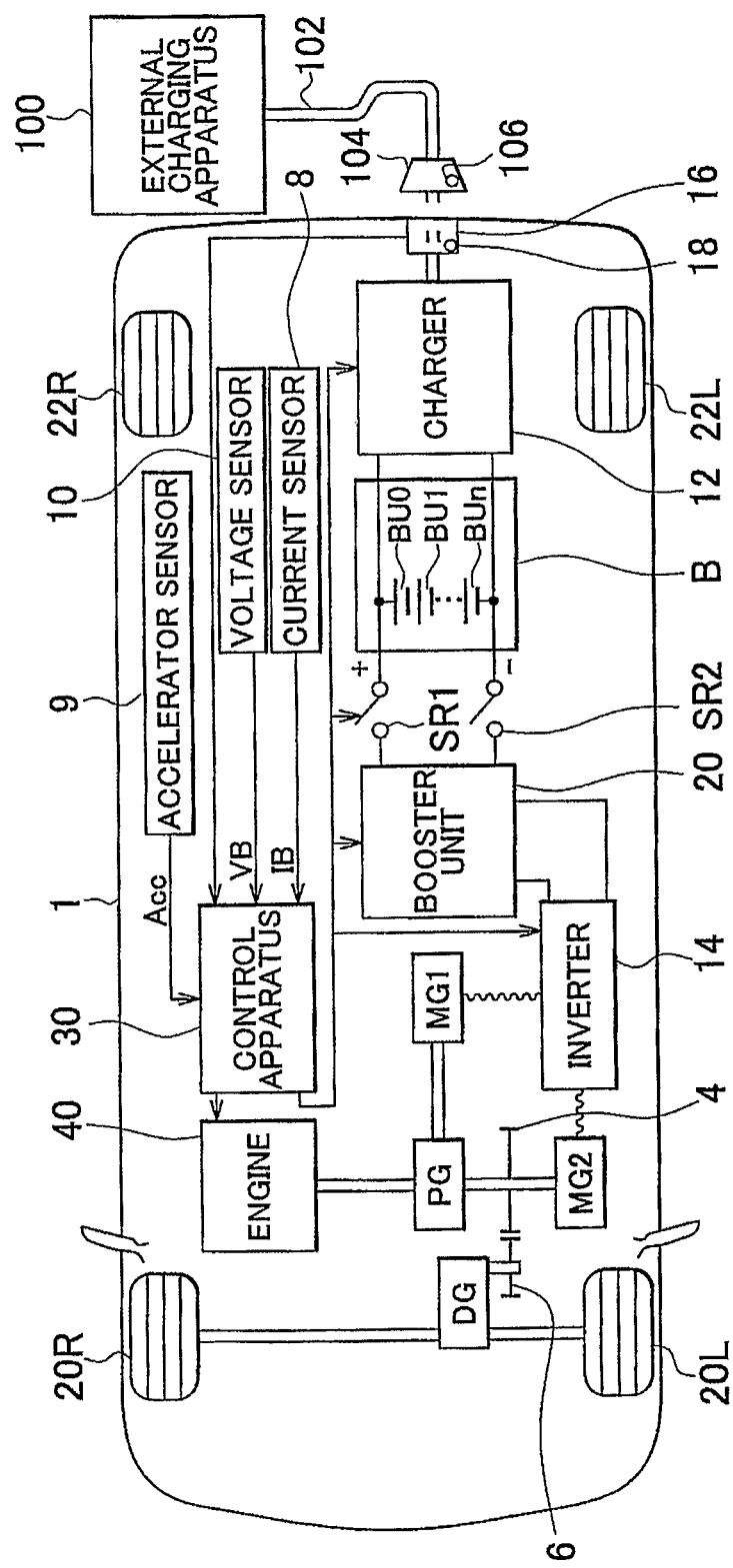
FIG. 1 is a block diagram showing the configuration of a HV of an embodiment of the invention.

FIG. 1 is a block diagram showing the configuration of a HV 1 of an embodiment of the invention. With reference to FIG. 1, the HV 1 includes front wheels 20R and 20L, rear wheels 22R and 22L, an engine 40, a planetary gear PG, a differential gear DG and gears 4 and 6.

The HV 1 further includes a battery B, a booster unit 20 that boosts direct current electrical power output by the battery B, and an inverter 14 that transfers direct current electrical power to and from the booster unit 20.

The HV 1 further includes a motor generator MG1 that generates electricity by receiving motive power from the engine 40 through the planetary gear PG, and a motor generator MG2 in which a rotating shaft is connected to the planetary gear PG. The inverter 14 is connected to the motor generators MG1 and MG2 and converts between alternating current electrical power and direct current electrical power front a booster circuit.

The planetary gear PG includes a sun gear, a ring gear, a pinion gear that engages with both the sun gear and the ring gear, a planetary carrier that rotatably supports the pinion gear on the periphery of the sun gear. The planetary gear PG has first to third rotating shafts. The first rotating shaft is a rotating shaft of the planetary carrier that is connected to the engine 40. The second rotating shaft is a rotating shaft of the sun gear that is connected to the motor generator MG1. The third rotating shaft is a rotating shaft of the ring gear that is connected to the motor generator MG2.

The gear 4 is attached to this third rotating shaft, and this gear 4 transmits mechanical motive power to the differential gear DG by driving the gear 6. In addition to transmitting mechanical motive power received from the gear 6 to the front wheels 20R and 20L, the differential gear DG transmits rotational force of the front wheels 20R and 20L to the third rotating shaft of the planetary gear PG through the gears 4 and 6.

The planetary gear PG fulfills the role of dividing motive power among the engine 40 and the motor generators MG1 and MG2 (role of a motive power dividing mechanism). Namely, the planetary gear PG determines rotation of one of the three rotating shafts corresponding to the rotation of the remaining two rotating shafts. Thus, the planetary gear PG controls vehicle speed by driving the motor generator MG2 by controlling the amount of electricity generated by the motor generator MG1 while allowing the engine 40 to operate in the most efficient range, thereby realizing a vehicle that has good overall energy efficiency.

The direct current power supply in the form of the battery B is composed by containing, for example, an olivine iron-based lithium ion secondary battery. In addition to supplying direct current electrical power to the booster unit 20, the battery B is charged by direct current electrical power from the booster unit 20.

The booster unit 20 boosts direct current voltage received from the battery B, and supplies the boosted direct current voltage to the inverter 14. The inverter 14 converts the supplied direct current voltage to alternating current voltage and drives and controls the motor generator MG1 during engine starting. In addition, after the engine has started, alternating current electrical power generated by the motor generator MG1 is converted to direct current by the inverter 14, and is then converted to a voltage suitable for charging the battery B by the booster unit 20 followed by charging of the battery B.

In addition, the inverter 14 drives the motor generator MG2. The motor generator MG2 assists the engine 40 to drive the front wheels 20R and 20L. During braking, the motor generator MG2 does not rotate, and rotational energy of the front wheels is converted to electrical energy. The resulting electrical energy is returned to the battery 13 by way of the inverter 14 and the booster unit 20.

The battery B is an assembled battery that contains a plurality of battery units BU0 to BUn that are connected in series. System relays SR1 and SR2 are provided between the booster unit 20 and the battery B that isolate high voltages when the vehicle is not operating.

The HV 1 further includes an input unit in the form of an accelerator sensor 9 that receives an acceleration request instruction from a driver and senses the position of the accelerator pedal, a current sensor 8 that detects the current of the battery B, a voltage sensor 10 that detects the voltage of the battery B, and a control apparatus 30 that controls the engine 40, the inverter 14 and the booster unit 20 corresponding to an accelerator depression amount Acc received from the accelerator sensor 9, a current IB received from the current sensor 8 and a voltage VB received from the voltage sensor 10. The current sensor 8 and the voltage sensor 10 respectively detect the current IB and the voltage VB of the battery B and transmit the current IB and the voltage VB to the control apparatus 30.

The HV 1 further includes a socket 16 for connecting a plug 104 provided on the end of a charging cable 102 that extends from an external charging apparatus 100, a coupling confirmation sensor 18 for confirming that the plug 104 is connected to the socket 16 by sensing a coupling confirmation element 106 of the plug 104 provided in the socket 16, and a charger 12 that receives alternating current electrical power from the external charging apparatus 100 by way of the socket 16. The charger 12 is connected to the battery B and supplies direct current electrical power for charging to the battery B. Furthermore, although the coupling confirmation sensor 18 may be of any type, for example, a type that senses a magnet on a plug, a pushbutton type that is pressed at the time of plug insertion, or a type that senses interconnection resistance of a conductive path can be used.

Figure 2:
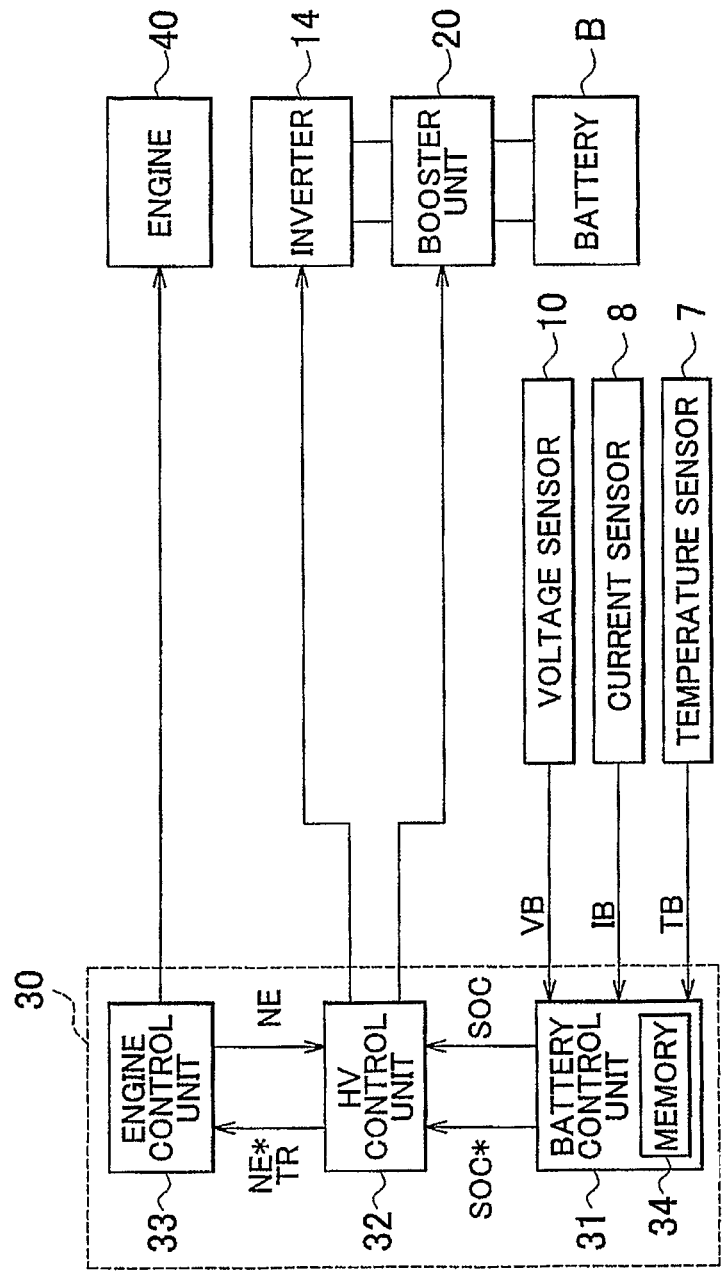
FIG. 2 is a block diagram showing an example of the configuration of a control apparatus of FIG. 1.

FIG. 2 is a block diagram showing an example of the configuration of the control apparatus 30 of FIG. 1. With reference to FIG. 2, the control apparatus 30 includes a battery control unit 31, an HV control unit 32, and an engine control unit 33.

In addition to monitoring the SOC of the battery B, the battery control unit 31 determines a central target value of the SOC in the form of a central value SOC*. The battery control unit 31 estimates the SOC based on an initial value stored in a memory 34 and the battery voltage VB, the battery current IB and the battery temperature TB respectively detected by the voltage sensor 10, the current sensor 8 and a temperature sensor 7. This estimation method consists of the use of a first estimation method that uses an internal reaction model that uses the battery voltage VB, and a second estimation method that adjusts the amount of charging and discharging by integrating the battery current IB. In the following description, the estimated value of the SOC as estimated by the battery control unit 31 is simply referred to as the SOC value.

In addition, in the case the estimated SOC value falls within a plateau region for a long period of time or the vehicle has been operated over a prescribed distance while the estimated SOC value falls within a plateau region, the battery control unit 31 changes the estimation method and causes the HV control unit 32 to change the charging and discharging states of the battery by changing the central value SOC* in order to improve estimation accuracy.

The HV control unit 32 determines engine output and motor torque corresponding to vehicle operating status as determined according to accelerator depression amount, shift position and signals from various types of sensors, and together with controlling the inverter 14 and the booster unit 20, issues a requested engine speed NE* command and an engine torque TR (command to the engine control unit 33.

The engine control unit 33 controls the degree of opening of an electronically controlled throttle body of the engine 40 in accordance with the value requested from the HV control unit 32.

The HV control unit 32 mainly adjusts the amount of electricity generated by the motor generator MG1 so that the estimated SOC value transmitted from the battery control unit 31 coincides with the central value SOC*. Namely, if the estimated value is greater than the central value SOC*, the electrical power consumed by the motor generator MG2 is controlled to be greater than the amount of electricity generated by the motor generator MG1 so that battery B is discharged. Conversely, if the estimated value is less than the central value SOC*, the amount of electricity generated by the motor generator MG1 is controlled to be greater than the electrical power consumed by the motor generator MG2 so that the battery B is charged. The accelerator depression amount of the engine 40 is also controlled by the engine control unit 33 to realize this type of control.

Furthermore, the control apparatus 30 is not limited to the configuration described here, but rather the entirety thereof may be realized with a single electronic control unit (ECU), or may further be realized by including a plurality of other ECU.

Figure 3:
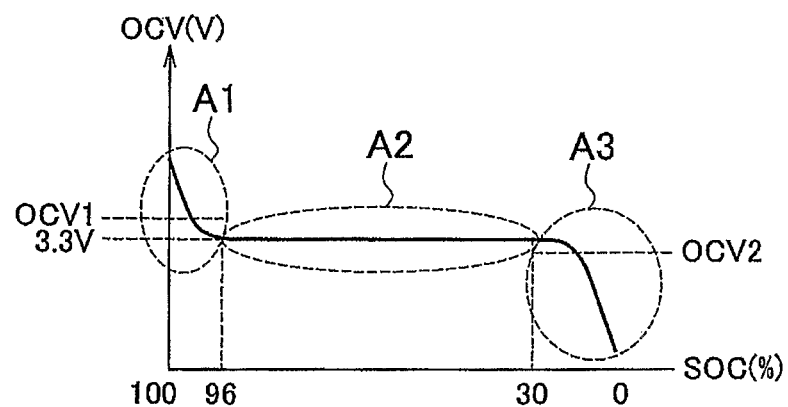
FIG. 3 is a drawing for explaining a method for estimating the SOC of a battery used in the embodiment.

FIG. 3 is a drawing for explaining a method for estimating the SOC of the battery B that is used in this embodiment.

With reference to FIG. 3, the manner in which OCV changes relative to changes in SOC of the battery B of FIG. 1 is shown. An example of the battery B that exhibits such characteristics is an olivine iron-based battery. In a battery in the manner of an olivine iron-based battery that has a long plateau region (region in which SOC ranges from 30% to 95% in an example of a battery that uses a carbon-based material for the anode), an estimation method that combines an SOC estimation method that uses an internal reaction model (such as that described in JP-A-2008-241246) and an SOC estimation method based on current integration is used preferably. In an SOC estimation method that uses an internal reaction model, SOC is estimated based on the battery voltage VB and the battery temperature TB. The corresponding SOC is estimated by determining the OCV after correcting for the effects of polarization and internal resistance on the battery voltage during vehicle operation. On the other hand, in an SOC estimation method based on current integration, SOC is estimated by determining the amount of change from the initial value of SOC based on battery current.

Characteristics of changes in OCV relative to SOC of the battery B in FIG. 1 are such that an SOC-OVC curve has a first region in which the amount of change in OCV relative to the amount of change in SOC exceeds a threshold value (region A1 or A3 in FIG. 3), and a second region in which the amount of change in OCV relative to the amount of change in SOC does not exceed a threshold value (region A2 in FIG. 3: plateau region). This threshold value is used to assess the slope of the SOC-OCV curve, and in consideration of the accuracy of the voltage sensor and the like, is set based on whether or not SOC can be uniquely determined relative to OCV. In the case the estimated value of SOC of the battery B falls within the first region (region A1 or A3), the control apparatus 30 updates the estimated value of SOC of the battery B by estimating SOC according to the first estimation method that uses the voltage VB of the battery B (estimation method based on an internal reaction model), while in the case the estimated value of SOC of the battery B falls within the second region (region A2: plateau region), the control apparatus 30 updates the estimated value of SOC of the battery B by estimating SOC according to the second estimation method that uses current input and output to and from the battery B (estimation method based on current integration). In the case the period during which the estimated value of SOC of the battery B falls within the second region (region A2: plateau region) exceeds a prescribed period, the control apparatus 30 estimates SOC with the first estimation method (estimation method based on an internal reaction model) by temporarily changing the SOC of the battery 13 so that the SOC of the battery B falls within the first region (region A1 or A3).

More specifically, in the regions A1 (in which, for example, SOC>95%) and A3 (in which, for example, SOC<30%) in which OCV has a slope, SOC is estimated using an internal reaction model. In addition, in the region A2, SOC is estimated by current integration.

In addition, although the example described here indicates switching of the estimation method corresponding to the SOC, the invention is not limited thereto, but rather the estimation method may also be defined based on the value of OCV. For, example, since the OCV in the plateau region in FIG. 3 is 3.3 V, the estimation method may be defined such that the SOC estimation method based on an internal reaction model is used in a high SOC region in which OCV is equal to or greater than a threshold value OCV1 (for example, 3.35 V) and in a low SOC region in which OCV is equal to or less than a threshold value OCV2 (for example, 3.25 V), while SOC is estimated based on current integration in the plateau region A2 in which OCV is between the threshold values OCV1 and OCV2 (for example, 3.25 to 3.35 V). Furthermore, with respect to specific values of OCV and SOC, although the explanation has indicated an example of a battery that uses a carbon-based material for the anode, the battery B may also be a battery other than an olivine iron-based lithium ion secondary battery provided it exhibits characteristics that have a plateau region. For example, the battery that has a plateau region includes $LiMPO_4$. The M is at least one of Fe, Mn, Cr, Co, Cu, Ni, V, Mo, Ti, Zn, Al, Ga, Mg, B and Nb.

The SOC estimation method indicated in FIG. 3 is extremely effective in the case of presuming battery use in a plug-in hybrid vehicle (PHV) as shown in FIG. 1.

Figure 4:
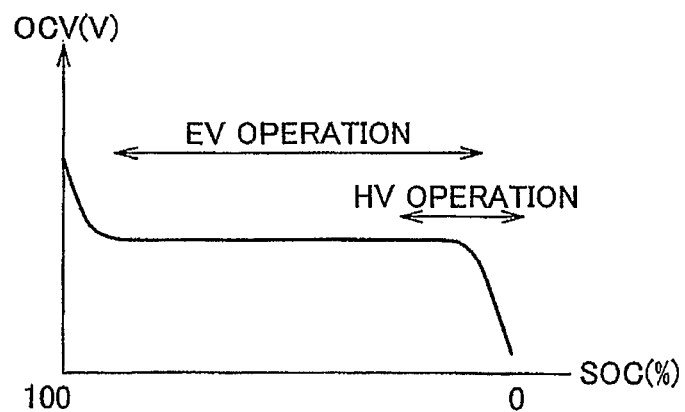
FIG. 4 is a drawing for explaining battery control in a PHV.

FIG. 4 is a drawing for explaining battery control in a PHV. With reference to FIG. 4, during operation of an EV which is completed in a comparatively short time following completion of plug-in charging (operating with the engine stopped), SOC is estimated based on current integration, and in the case discharging of the battery progresses and the estimated value of SOC approaches 0% and leaves the plateau region, HV operation is carried out in the vicinity of region A3 of FIG. 3 (operating with the engine being able to be started as necessary). During this HV operation, SOC is estimated based on an internal reaction model.

When assuming, for example, typical battery use in a PHV, EV operation is begun from the region in which SOC is high immediately after completion of plug-in charging, and the operating mode is changed to HV operation when it enters a region in which SOV is low. If estimation of SOC based on current integration is carried out for a long period of time, integration error accumulates resulting in the risk of a discrepancy in estimated SOC values. However, in vehicles in which battery capacity is not that high, since the vehicle is not able to operate for an overly long period of time, the estimation error does not have a considerable effect during short-term EV operation.

In addition, in the estimation method based on an internal reaction model that is used after having switched to HV operation, since SOC is estimated using only the battery temperature and the battery voltage VB without using values of current integration, estimation is not affected by error of the current sensor 8. Since the error of the current sensor 8 is subjected to integration processing, it has a greater effect on estimated values of SOC than error of the voltage sensor 10. Consequently, if a control target value of SOC is moved to a region in which SOC is low, and estimation is begun based on an internal reaction model in region A3 of FIG. 3 in which the OCV is sloped, even if the estimation error of SOC increases due to current integration error during EV operation, since HV operation is carried out subsequently thereto, SOC error decreases as estimation based on an internal reaction model proceeds. Since the voltage VB is input in an internal reaction model, even if estimation begins from a state in which SOC error is large, the estimated SOC approaches the true SOC during the time estimation continues, thereby resulting in SOC error being reduced automatically.

In other words, in an internal reaction model, SOC is estimated by utilizing the fact that OCV has a slope. In order to estimate SOC with high accuracy, the battery is used based on a control target central value of SOC in the region where OCV has a slope (for example, where SOC<30%) during HV operation based on the assumption of long-term operation following EV operation. If the battery is used only in this region, SOC can be estimated based only on an internal reaction model without estimating SOC based on current integration.

More specifically, in a battery that uses olivine iron for the cathode and graphite for the anode, the cell voltage in the plateau region is about 3.3 V. Thus, control of battery charging and discharging is carried out so that HV operation is carried out using only the region in which OCV has a slope (for example, region where the SOC is 30% or less or region where the OCV is 3.25 V or less).

Figure 5:
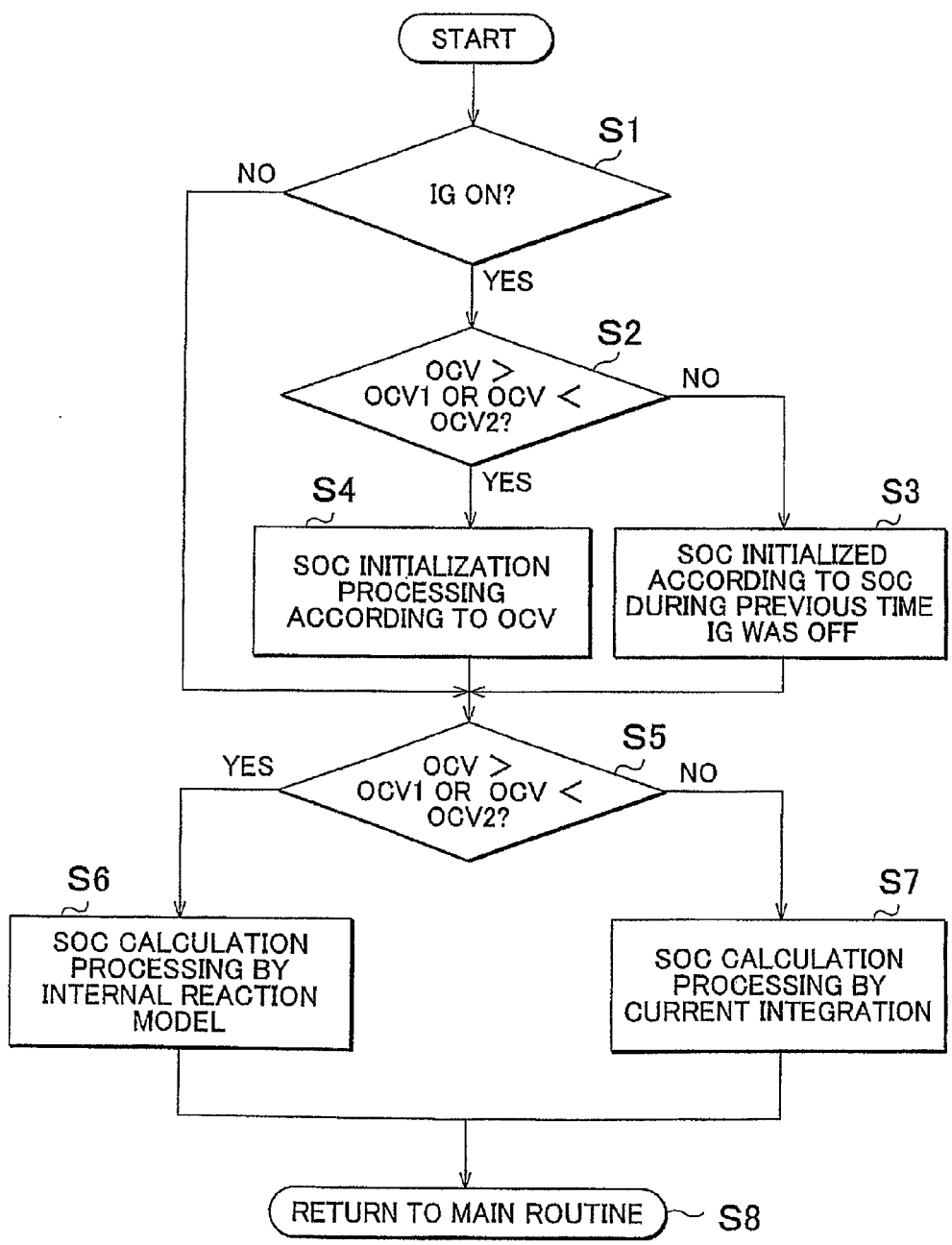
FIG. 5 is a flow chart for explaining processing for calculating SOC that is executed in the battery control unit of FIG. 2.

FIG. 5 is a flow chart for explaining processing for calculating SOC that is executed in the battery control unit 31 of FIG. 2. The processing of this flow chart is executed by being recalled from a main routine of vehicle control at fixed time intervals or whenever prescribed conditions are satisfied.

With reference to FIG. 5, when processing is first started, a determination is made as to whether or not IG is ON in Step S1. When IG is ON, this indicates the case, for example, in which a key is inserted into the vehicle and the vehicle has been started, and as a result thereof, initial values and so forth are loaded into the control apparatus 30.

In the case IG is not ON in Step S1, processing proceeds to Step S5. On the other hand, in the case IG is ON in Step S1, processing proceeds to Step S2.

In Step S2, a determination is made as to whether or not the OCV of the battery at the time of vehicle starting is greater than OCV1 or less than OCV2. A determination as to whether or not the OCV is in region A2 of FIG. 3 is then made on the basis thereof. Furthermore, a determination may also be made as to whether or not the estimated SOC value falls within region A2. The OCV used in Step S2 can be obtained by, for example, measuring a measured value VB of the voltage sensor 10 in the state in which the system relays SR1 and SR2 are open.

Processing proceeds to Step S3 in the case OCV>OCV1 or OCV<OCV2 in Step S2. In this case, the SOC of the battery B falls within the region A2 of FIG. 3, SOC cannot be uniquely specified from OCV. Thus, in Step S3, the estimated value of SOC is initialized according to the estimated value of SOC during the previous time IG was OFF.

On the other hand, processing proceeds to Step S4 in the case the condition of OCV>OCV1 or OCV<OCV2 is satisfied in Step S2. In this case, the SOC of the battery B falls within the region A1 or the region A3 of FIG. 3. Consequently, since SOC can be determined from OCV, SOC is initialized using the SOC corresponding to OCV. Namely, the SOC determined based on the detected OCV is set to an initial value SOCini of the estimated value.

Processing proceeds to Step S5 upon completion of the processing of Step S3 or Step S4. In Step S5, a determination is made as to whether or not OCV>OCV1 or OCV<OCV2 in the same manner as in Step S2. Processing proceeds to Step S6 in the case the condition of OCV>OCV1 or OCV<OCV2 is satisfied in Step S5, and proceeds to Step S7 when either or those conditions is not satisfied.

In Step S6, since the SOC of the battery B falls within either the region A1 or the region A3 of FIG. 3, SOC calculation processing is executed according to an internal reaction model (first estimation method). On the other hand, since the SOC of the battery falls within the plateau region A2 in Step S7, SOC calculation processing is executed according to current integration (second estimation method). When the SOC is estimated by either calculation processing in Step S6 or Step S7, the estimated value of SOC is updated, processing proceeds to Step S8, and control is returned to the main routine.

Figure 6:
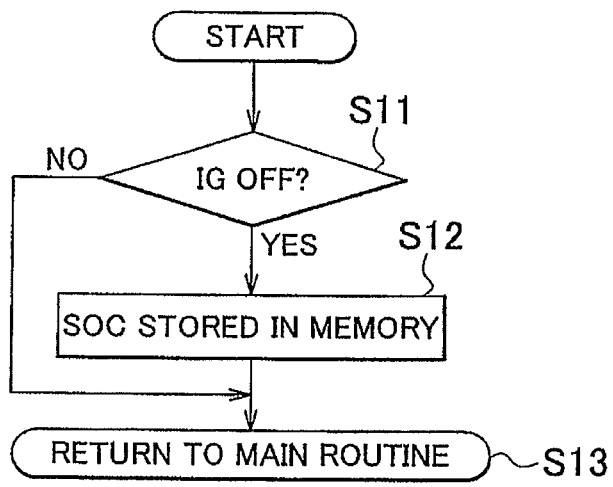
FIG. 6 is a flow chart for explaining processing when a vehicle is stopped that is executed in a battery control unit.

FIG. 6 is a flow chart for explaining processing when the vehicle is stopped that is executed in the battery control unit 31. The processing of this flow chart is executed by being recalled from the main routine of vehicle control at fixed time intervals or whenever prescribed conditions are satisfied.

With reference to FIG. 6, when processing is first started, a determination is made as to whether or not IG is OFF in Step S11, namely a determination is made as to whether or not an instruction to stop the vehicle system has been input with an ignition key and the like. In the case IG is not OFF in Step S11, processing is returned to the main routine in Step S13. On the other hand, processing proceeds to Step S12 when IG has been determined to be OFF in Step S11. The current SOC estimated value is stored in the memory 34 of FIG. 2 in Step S12. The stored value is used for the initial value of Step S3 of FIG. 5. Processing proceeds to Step S13 upon completion of the processing of Step S12, and control is returned to the main routine.

In the case of carrying out HV operation, the SOC of the battery decreases when controlling power torque of the motor by assisting the engine, while SOC increases in the case of regenerative braking by the motor such as when decelerating on a downgrade. However, even if energy is recovered by regenerative braking, the battery is unable to receive that energy in a state in which the SOC is high.

Conversely, in a state in which the SOC is not that low, electrical power required for driving the motor in the case of sudden acceleration using the motor cannot be discharged from the battery.

Thus, the battery SOC is preferably that enables acceptance of electrical power to a certain extent as well as discharge of electrical power. Consequently, the HV control unit 32 of FIG. 2 adjusts the amount of electricity generated by a generator by controlling the inverter 14 so that the battery SOC coincides with a certain central value following temporary regeneration or powering. This central value is represented by SOC*. Although FIG. 4 indicates an example of fixing the central value SOC* during HV operation to a low state, the central value SOC* is not required to be set to a low value at all times, but rather the central value SOC* may be put into a low state only during cancellation of SOC estimation error.

Figure 7:
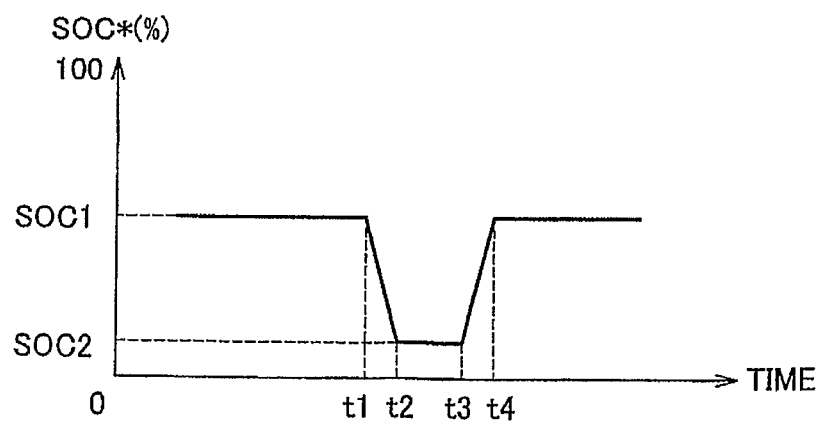
FIG. 7 is a waveform diagram showing an example of temporarily changing a central target value of SOC in the form of a central value SOC*.
Figure 8:
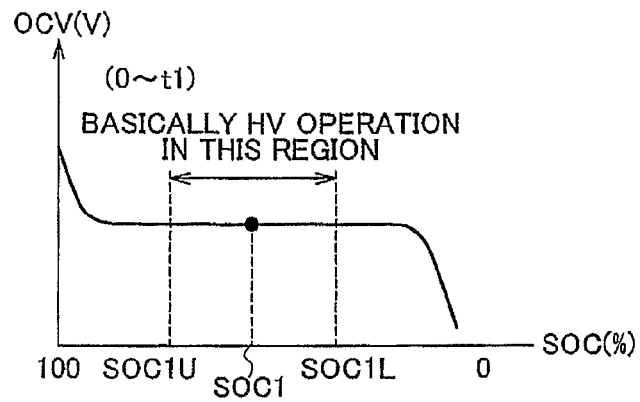
FIG. 8 is a drawing for explaining a central value SOC* of SOC through time t1 of FIG. 7.

FIG. 7 is a waveform diagram showing an example of temporarily changing SOC*. FIG. 8 is a drawing for explaining the central value SOC* of SOC through a time t1 in FIG. 7.

With reference to FIGS. 7 and 8, the central value SOC* during HV operation under normal circumstances is a value SOC1 that lies within the plateau region (for example, the region ranging from 30% to 95% in the example of a battery that uses a carbon-based material for the anode). Under normal circumstances, HV operation is basically carried out only in this region.

Since motor regeneration and powering occur due to acceleration or deceleration and the like, the amount of electricity generated by a generator is adjusted so that SOC lies between an upper limit value SOC1U and a lower limit value SOC1L centering about SOC1. Since there is hardly any change in OCV in this plateau region, SOC is estimated by current integration. However, if estimation of SOC by current integration continues for a long period of time, error in estimated SOC values increases due to accumulation of current integration error.

Therefore, in this embodiment, the continuous duration of HV operation, total distance traveled and the like in the plateau region are measured, and in the case the measured value has exceeded a limit, the central value SOC* of the SOC is temporarily changed to a low SOC region (for example, SOC<30%). The central value SOC* of the SOC is changed from SOC1 to SOC2 from time t1 to t2 in FIG. 7.

Figure 9:
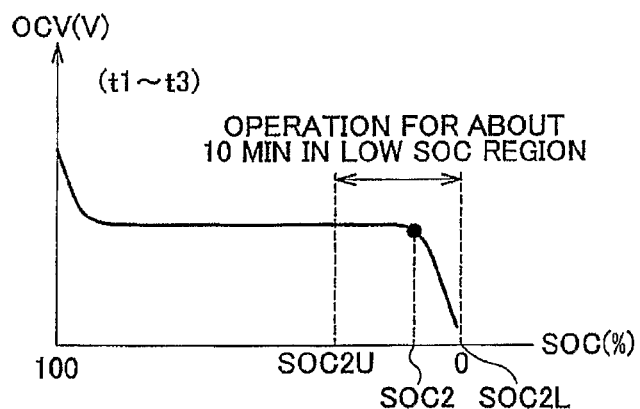
FIG. 9 is a drawing for explaining a state in which a central value SOC* of SOC during HV operation is temporarily changed.

FIG. 9 is a drawing for explaining a state in which the central value SOC* of the SOC is temporarily changed during HV operation.

With reference to FIG. 9, the central value SOC* of the SOC is controlled to as to coincide with SOC2 from time t2 to time t3 in FIG. 7. In this manner, HV operation is temporarily executed in the region in which OCV has a slope. The duration of this HV operation may be, for example, about 10 minutes. During this time, the upper limit value is set to SOC2U and the lower limit value is set to SOC2L, and the amount of electricity generated is adjusted so that SOC lies there between. During this time, since estimation of SOC is carried out based on an internal reaction model according to the control explained in FIGS. 3 and 5, error in estimated SOC values is reduced and estimated values of SOC approach the true value of SOC.

Namely, voltage is input in an internal reaction model used in the case shown in FIG. 9. Since estimation of SOC is carried out using only battery temperature and the voltage VB without using current integration values in the estimation method based on an internal reaction model, error of the current sensor 8 has little effect on estimated values of SOC. Since error of the current sensor 8 is attributable to integration processing, error of the voltage sensor 10 has less effect on SOC estimated values. Consequently, even if estimation is begun from a state in which SOC estimation error is large, during the time estimation processing continues, estimated values approach the true SOC value and SOC estimation error is reduced automatically.

The central value SOC* is again returned to the original SOC1 value during the subsequent times t3 to t4 in FIG. 7.

Figure 10:
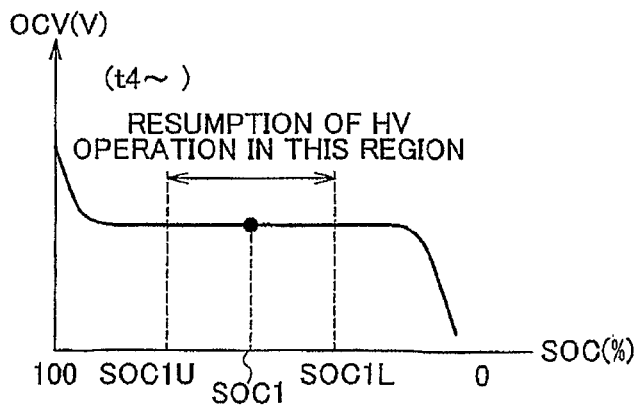
FIG. 10 is a drawing showing the state of a central value SOC* starting at time t4 of FIG. 7.

FIG. 10 is a drawing that shows the state of the central value SOC* at time t4 and beyond in FIG. 7. Although there may be cases in the state shown in FIG. 9 in which acceleration may be end up being limited such as when acceleration continues for a long period of time due to the low SOC, by returning the central value SOC* to the vicinity of the center as shown in FIG. 10, the amount of electrical power that can be continuously output from the battery increases, thereby making it possible to improve the acceleration performance of the vehicle.

In the case the continuous duration of HV operation of total distance traveled and the like have reached the limit values thereof, temporarily changing the central value SOC* of SOC as shown in FIG. 7 enables a continuous increase in SOC estimation error to be prevented.

Furthermore, although the explanation here has described the low SOC region (for example, 30% or less) as an example of region in which OCV has a slope, since OCV also has a slope in the high SOC region (for example, SOC>95%), the same technique can be applied. However, since accelerated battery deterioration is predicted to become a problem in the high SOC region particularly in the case of lithium ion batteries, this technique is preferably executed in the low SOC region.

Figure 11:
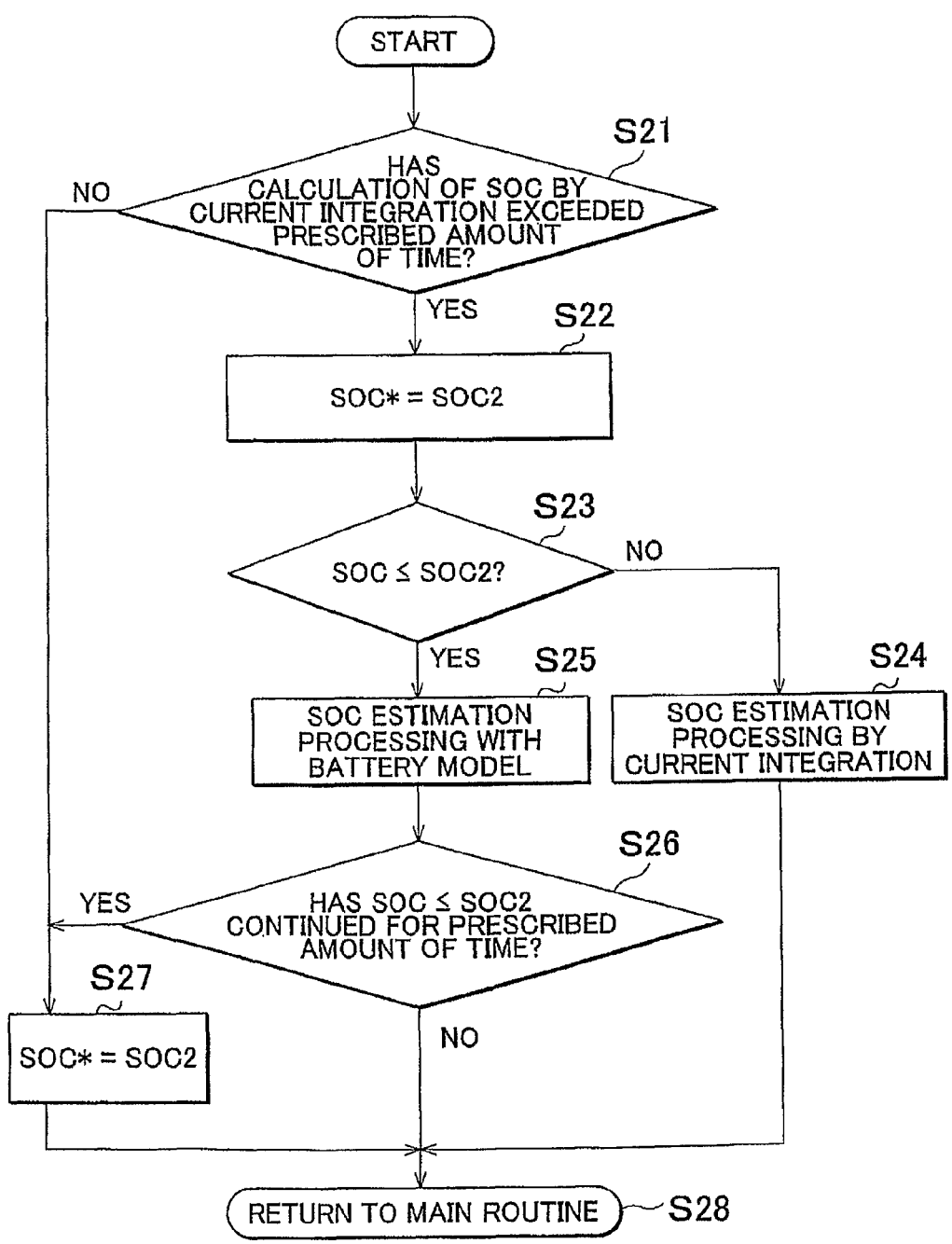
FIG. 11 is a flow chart for explaining processing for moving a central value of SOC.

FIG. 11 is a flow chart for explaining processing for moving the central value of SOC. The processing of this flow chart is executed by being recalled from the main routine of vehicle control at fixed time intervals or whenever prescribed conditions are satisfied.

With reference to FIG. 11, a determination is first made in Step S21 as to whether or not the duration of calculation of SOC by current integration has exceeded a prescribed amount of time. Furthermore, a determination may also be made as to whether or not distance traveled in the case of calculating SOC by current integration has exceeded a prescribed distance instead of the prescribed amount of time.

Processing proceeds to Step S27 in the case calculation of SOC by current integration has not exceeded the prescribed amount of time in Step S21 (NO in Step S21). In Step S27, the central value SOC* of SOC is set to the value of SOC1 as shown in FIG. 8. HV operation is basically carried out in this region.

On the other hand, processing proceeds to Step S22 in the case the duration of calculation of SOC by current integration has exceeded the prescribed amount of time in Step S21 (YES in Step S21). In Step S22, the central value SOC* of the SOC is set to the value of SOC2 that is lower than SOC1 as shown in FIG. 9. In Step S23, a determination is made as to whether or not the current estimated SOC value is equal to or less than SOC2. Furthermore, SOC2 is set here to a value that is less than, for example, 30%. Namely, SOC2 is set to a region in which OCV has a slope and in which. SOC can be uniquely determined based on OCV.

In the case the condition of SOC≤SOC2 is not satisfied in Step S23 (NO in Step S23), since this means that the actual SOC of the battery is still in the region indicated in FIG. 9 even though the target value has been set to SOC2, processing proceeds to Step S24 and SOC estimation processing is executed by current integration.

On the other hand, processing proceeds to Step S25 in the case the condition of SOC≤SOC2 has been satisfied in Step S23 (YES in Step S23).

SOC estimation processing based on a battery model is executed in Step S25. As a result, SOC estimation error that had been increasing due to current integration is reduced. In Step S26 following Step S25, a determination is made as to whether or not the amount of time the SOC estimated value is equal to or less than SOC2 has continued for a prescribed amount of time. This prescribed amount of time is set an amount of time that is sufficient for cancelling SOC estimation error (for example, about 10 minutes).

In the case the amount of time the SOC estimated value is equal to or less than SOC2 has continued has been determined to have reached the prescribed amount of time in Step S26, processing proceeds to Step S27 and the central value SOC* of the SOC is set to SOC1. Processing subsequently proceeds to Step S28. In addition, processing also proceeds to Step S28 once the processing of Step S27 and the processing of Step S24 have been completed. Control is then returned to the main routine in Step S28.

Batteries used in EVs house a plurality of battery cells or battery units in a single battery pack in order to realize large capacity and high voltage. In such cases, there is a risk of a specific battery cell or battery unit becoming overdischarged or overcharged in the case variations occur in SOC among the plurality of battery cells or among the plurality of battery units. In such cases, equalization processing is carried out that equalizes the SOC of each battery cell, or battery unit.

Figure 12:
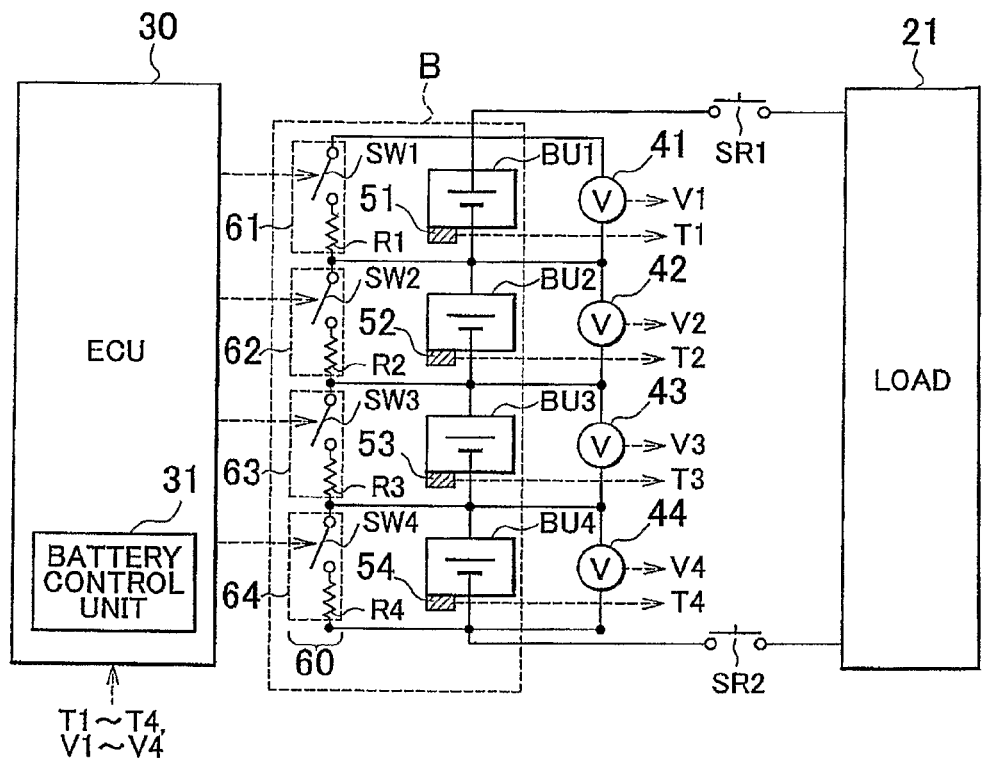
FIG. 12 is a drawing showing the configuration of an equalization circuit for carrying out equalization processing.

FIG. 12 is a drawing that shows the configuration of an equalization circuit for carrying out equalization processing. FIG. 12 shows a battery B, a load 21 that is supplied with electrical power from the battery B, and a control apparatus 30 that controls operation of the battery B. Moreover, system relays SR1 and SR2 are provided between the battery B and the load 25 in order to control connection and non-connection between the two. Each system relay SR1 and SR2 is switched corresponding to a control signal not shown.

The battery B includes a plurality of battery units BU1 to BU4 connected in series, and an equalization circuit 60 for carrying out equalization processing on the battery B. Each battery unit BU1 to BU4 contains a single battery cell or a plurality of battery cells connected in series, in parallel or in series-parallel. Each battery unit BU1 to BU4 preferably has a mutually equal battery capacity. The battery B is typically installed in an EV or a HV for use as a power supply for driving the vehicle.

Voltage sensors 41 to 44 are respectively provided in parallel with the battery units BU1 to BU4. The voltage sensors 41 to 44 respectively detect output voltages V1 to V4 of the battery units BU1 to BU4, and transmit the detected output voltages V1 to V4 to the control apparatus 30. Moreover, temperature sensors 51 to 54 are respectively provided corresponding to the battery units BU1 to BU4. The temperature sensors 51 to 54 respectively detect temperatures (battery temperatures) T1 to T4 of the battery units BU1 to BU4 and transmit the detected battery temperatures T1 to T4 to the control apparatus 30. Each temperature sensor 51 to 54 is attached to the casing of the corresponding battery unit BU (to be used hereinafter when generically referring to the battery units BU1 to BU4).

The control apparatus 30 includes a battery control unit 31 that calculates the SOC of the battery B. The battery control unit 31 is a function block realized by executing a program preliminarily stored in the control apparatus 30.

The battery control unit 31 estimates the SOC of the entire battery B as well as the SOC of each of the individual battery units BU1 to BU4 corresponding to detected values of the voltage sensors 41 to 44, the temperature sensors 51 to 54 and suitably arranged current sensors (not shown). Since the OCV of each battery unit BU1 to BU4 conventionally has a strong correlation with SOC in the case the state of the battery B is in region A1 or region A3 of FIG. 3 in particular, SOC values are mainly calculated based on the output voltages V1 to V4 detected by the voltage sensors 41 to 44.

The equalization circuit 60 includes discharge bypass circuits 61 to 64 respectively provided in parallel with the battery units BU1 to BU4. The bypass circuit 61 has a switching element SW1 and a resistor element R1 connected in series, and the bypass circuit 62 has a switching element SW2 and a resistor element R2 connected in series. Similarly, the bypass circuit 63 has a switching element SW3 and a resistor element R3 connected in series, and the bypass circuit 64 has a switching element SW4 and a resistor element R4 connected in series. Switching on and off of the switching elements SW1 to SW4 is respectively and independently controlled by the control apparatus 30.

Next, an explanation is provided of operation of the equalization circuit. During operation of the load 25, the system relays SR1 and SR2 are switched on when the ignition of an EV or a HV is on (during IG-ON), and the battery B is charged or discharged corresponding to the operation of the load 21. The battery control unit 31 sequentially calculates the SOC value of the entire battery B and each battery unit BU1 to BU4 based on the output from each sensor.

When the load 21 is stopped, the system relays SR1 and SR2 are switched off when the ignition of the EV or HV is off (during IG-OFF). Equalization processing for limiting variations in SOC among the battery units BU1 to BU4 is executed by the equalization circuit 60 during periods when the battery is not used in which the system relays SR1 and SR2 are switched off (load stoppage periods).

During the equalization processing, the switching element SW1 to SW4 are switched on in each of the bypass circuits 61 to 64 during operation (discharge operation), and the switching elements SW1 to SW4 are switched off when stopped. Each bypass circuit 61 to 64 maintains the residual capacity of the corresponding battery unit BU when stopped by discharging the corresponding battery unit BU during operation. Thus, by selectively switching on the switching elements SW1 to SW4 corresponding to the SOC values of the battery units BU1 to BU4 to selectively discharge battery units in which residual capacity is relatively high, variations in the SOC of each battery unit BU1 to BU4 can be reduced.

Figure 13:
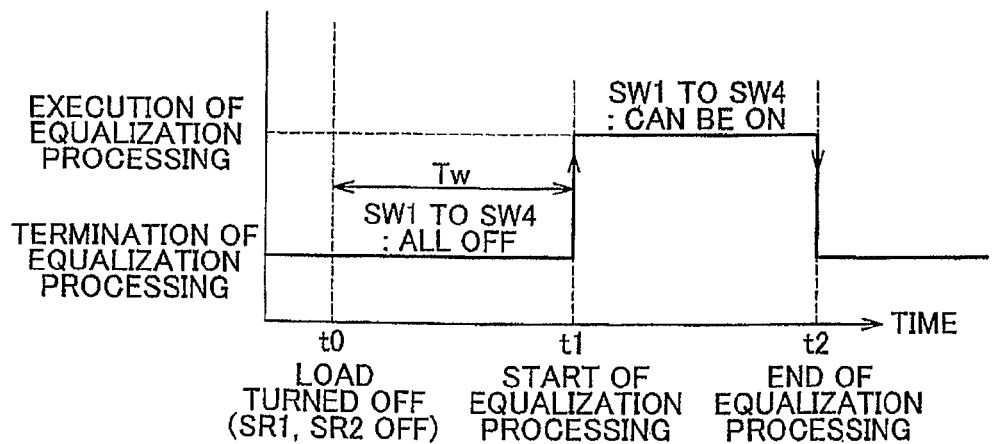
FIG. 13 is a waveform diagram for explaining the operation of equalization processing.

FIG. 13 is a waveform diagram for explaining operation of the equalization circuit. As shown in FIG. 13, the control apparatus 30 sets a waiting period Tw from a time t0 when the load 21 is turned off to a time t1 when the above-mentioned equalization processing is started when the load 21 is stopped. The waiting period Tw is typically defined by an elapsed time.

The control apparatus 30 discontinues equalization processing on the battery 13 by switching all of the switching elements SW1 to SW4 off during load operation and during the waiting period (prior to time a).

Starting at the time t1 at which the waiting period Tw has elapsed from the stopping time t0, the control apparatus 30 selectively switches the switching elements SW1 to SW4 on or off so that the SOC of the battery units BU1 to 1304 are equalized in order to carry out equalization processing.

Equalization processing is executed starting at the time t1 by selectively switching the switching elements SW1 to SW4 on and off. During the course of equalization processing, the SOC value of each battery unit BU1 to BU4 is sequentially calculated by the battery control unit 31, and if variations in the SOC of the battery units BU1 to BU4 are within a prescribed range as a result of equalization processing at a time t2, equalization processing is terminated and all of the switching elements SW1 to SW4 are again switched off.

The following provides an explanation of a technique for correcting discrepancies in SOC estimated values by equalization processing in the case variations have occurred in the SOC among battery cells or battery units in a battery pack of an olivine iron-based battery. This technique is effective when assuming the use of a HV in the case the central value SOC* of the SOC during HV operation is in a plateau region (region in which, for example, the SOC covers a range of 30% to 95% in an example of a battery that uses a carbon-based material for the anode), or in other words, in the case of basically carrying out HV operation only within the plateau region.

Figure 14:
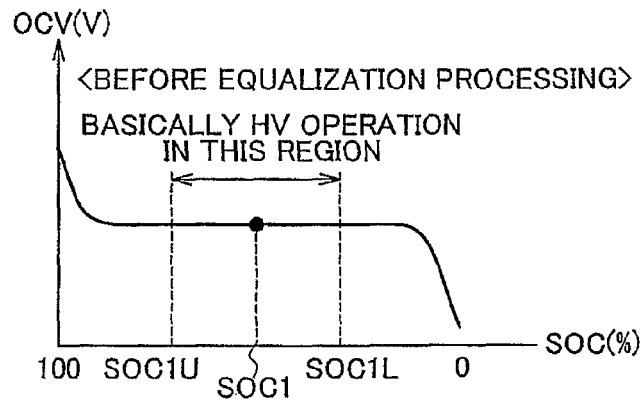
FIG. 14 is a drawing for explaining a central value SOC* of SOC prior to equalization processing.

FIG. 14 is a drawing for explaining the central value SOC* of SOC prior to equalization processing.

Namely, as shown in FIG. 14, in HV driving the amount of electricity generated is controlled so that the central value SOC* of SOC coincides with the value of SOC1 located nearly in the center of the plateau region.

Here, the battery typically undergoes self-discharge, and there are variations in self-discharge among battery cells. Consequently, variations naturally occur in SOC among the battery cells. In a related art in the form of a lithium ion battery pack (lithium ion battery pack that uses a nickel-based or cobalt-based active material), SOC values are adjusted by using an equalization circuit in the case SOC variations have occurred among battery cells or battery units.

This type of lithium ion battery pack carries out equalization processing by making OCV values coincide in a plurality of battery cells or battery units by forcibly discharging those battery cells or battery units that have a large OCV value by utilizing the 1:1 relationship between OCV and SOC.

In contrast, in the case of assuming HV operation (in use of cells) in the plateau region only (region in which, for example, the SOC covers a range of 30% to 95% in an example of a battery that uses a carbon-based material for the anode) when using an olivine iron-based battery, OCV remains roughly the same even though the SOC changes. Thus, if variations occur in the SOC among battery cells or battery units, it is extremely difficult to adjust the SOC according to differences in OCV values in the manner of the lithium ion battery back of the related art.

Therefore, once every few weeks, the central value SOC* of the SOC is moved to the low SOC region in which the OCV has a slope (for example, region in which SOC<30%), HV operation is carried out, and the central value SOC* of the SOC remains set in the low SOC region until an instruction to switch the IG off is received.

Figure 15:
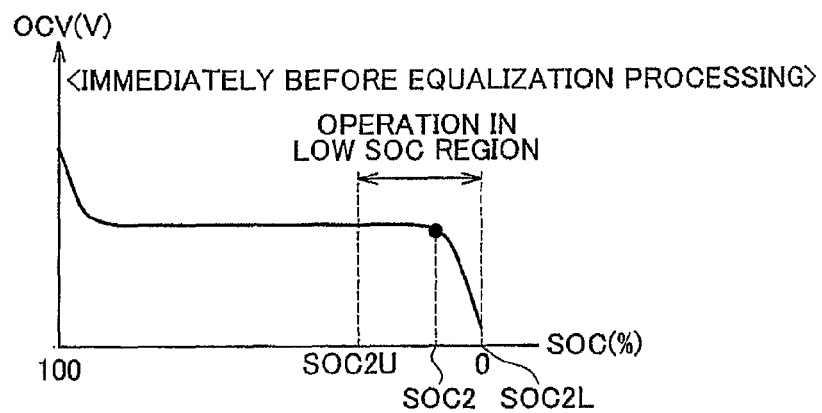
FIG. 15 is a drawing for explaining the state of SOC during equalization processing.
Figure 16:
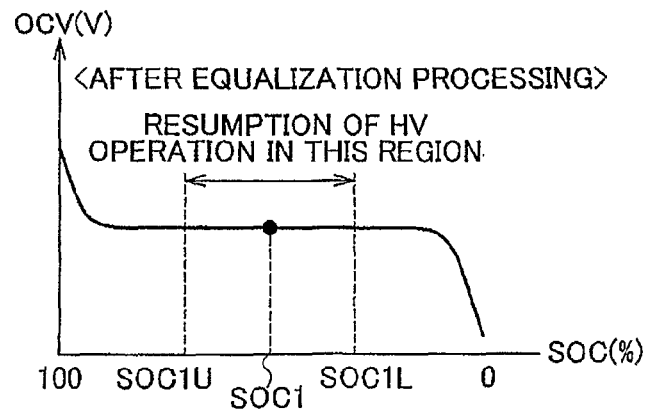
FIG. 16 is a drawing for explaining the state of SOC after equalization processing.

FIG. 15 is a drawing for explaining the state of SOC during equalization processing. FIG. 16 is a drawing for explaining the state of SOC after equalization processing.

In this embodiment, the central value SOC* of the SOC is moved to the low SOC region (for example, region in which SOC<30%) in which OCV has a slope once every few weeks as shown in FIG. 15. HV operation is then carried out while in this state. A command to switch the IG off is then awaited while in the state in which the central value SOC* of the SOC is set to the low SOC region. When a command to switch the IG off is input, discharge is controlled so that SOC values coincide in all the battery cells or battery units as a result of equalizing the cell voltages with the equalization circuit.

Subsequently, the central value SOC* of the SOC returns to the original plateau region when operation is resumed as shown in FIG. 16.

Here, although the explanation has described the low SOC region as an example of region in which OCV has a slope, since OCV also has a slope in the high SOC region (for example, SOC>95%), the same technique can be applied. However, since accelerated battery deterioration is predicted to become a problem when maintaining long-term operation in the high SOC region particularly in the case of lithium ion batteries, equalization processing is preferably executed in the low SOC region.

Figure 17:
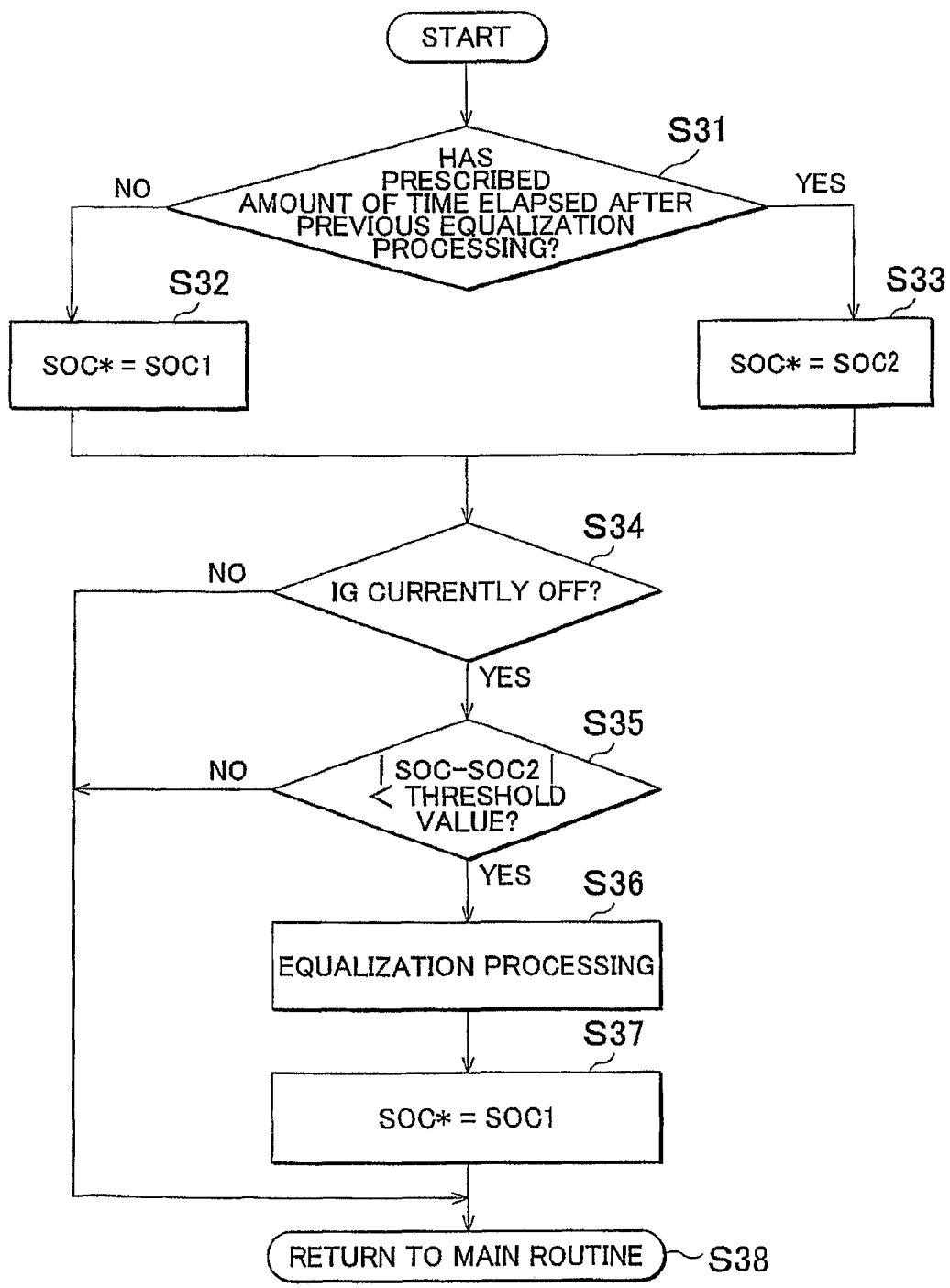
FIG. 17 is a flow chart for explaining control of a central value of SOC during equalization processing.

FIG. 17 is a flow chart for explaining control of the central value SOC* of SOC during equalization processing. The processing of this flow chart is executed by being recalled from the main routine of vehicle control at fixed time intervals or whenever prescribed conditions are satisfied.

With reference to FIG. 17, when processing is first started, a determination is made in Step S31 as to whether or not a prescribed amount of time has elapsed after carrying out the previous equalization processing.

Processing proceeds to Step S32 if the prescribed amount of time has still not elapsed in Step S31, and the central value SOC* of the SOC is set to SOC1. On the other hand, processing proceeds to Step S33 in the case the prescribed amount of time has elapsed in Step S31, and the central value SOC* is set to SOC2. Processing proceeds to Step S34 when the value of SOC* is set in Step S32 or Step S33.

In Step S34, a determination is made as to whether or not the IG is off. The IG being off refers to a duration from the time a driver operates a key switch to command the vehicle to stop to the time a series of vehicle stopping processing is completed.

Processing proceeds to Step S35 in the case it has been determined in Step S34 that processing for switching the IG off is currently in progress. In Step S35, a determination is made as to whether or not an absolute value of the difference between the estimated SOC and the value of SOC2 is smaller than a prescribed threshold value.

In the case the condition of |SOC−SOC2|<threshold value is satisfied in Step S35, processing proceeds to Step S36 and equalization processing is executed. The central value SOC* is again returned to SOC1 in Step S37.

In the case a determination of NO results in Step S34 and Step S35 and the processing of Step S37 has been completed, processing proceeds to Step S38 and control is returned to the main routine.

In this variation, a technique is indicated for correcting discrepancies in estimated SOC values by discharge processing and equalization processing in the case variations have occurred in the SOC among battery cells or battery units in an olivine iron-based battery pack.

Figure 18:
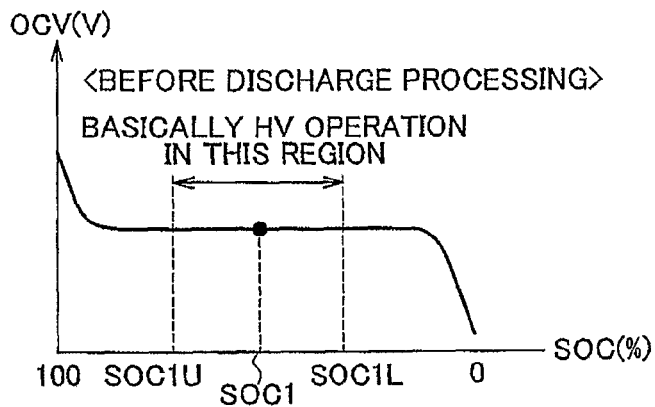
FIG. 18 is a drawing showing a central value of SOC during HV operation prior to discharge processing.
Figure 19:
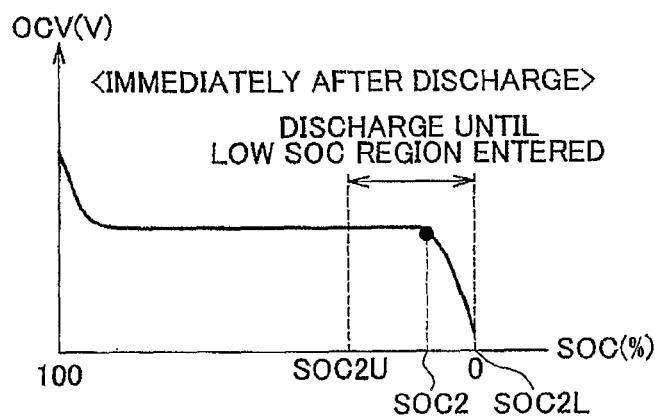
FIG. 19 is a drawing showing a central value of SOC immediately after having carried out discharge processing.

FIG. 18 is a drawing showing the central value of SOC during HV operation prior to discharge processing. FIG. 19 is a drawing showing the central value of SOC immediately after discharge processing.

Figure 20:
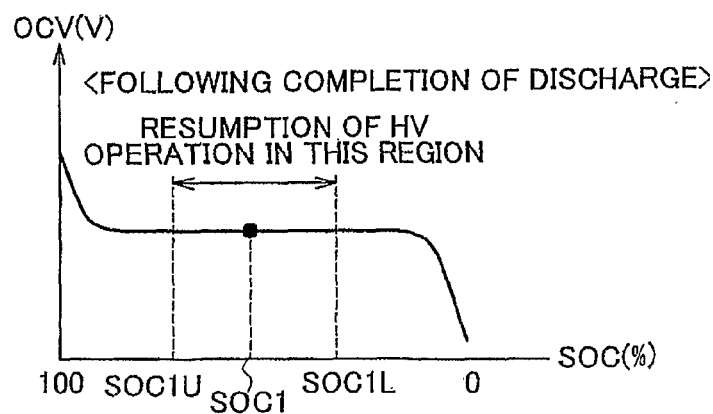
FIG. 20 is a drawing showing a central value of SOC in the case of having carried out HV operation again following completion of discharge processing of FIG. 19.

FIG. 20 is a drawing showing the central value of SOC in the case of having carried out HV operation again after discharge processing of FIG. 19 has been completed.

As shown in FIG. 18, the central value SOC* of the SOC during HV operation is set to a plateau region (region in which, for example, the SOC covers a range of 30% to 95% in an example of a battery that uses a carbon-based material for the anode). In this example, HV operation is carried out in the state in which the central value SOC* of the SOC is set to SOC1.

As was previously described, in the case of assuming HV operation in the plateau region only when using an olivine iron-based battery, if variations occur in the SOC among a plurality of battery cells or battery units, it is extremely difficult to adjust the SOC with an equalization circuit. This is because the OCV remains nearly constant even if the SOC changes.

Therefore, as shown in FIG. 19, once every few weeks, discharge is temporarily carried out until the SOC enters the low SOC region (for example, region in which SOC<30%) in which OCV has a slope by connecting a resistor and the like between the battery electrodes while the vehicle is stopped following completion of HV operation. When the battery state becomes as shown in FIG. 19, equalization of cell voltage is carried out in that SOC region with the equalization circuit and SOC values are aligned in all the battery cells.

Subsequently, when operation is resumed, the central value SOC* of the SOC returns to the original plateau region as shown in FIG. 20.

Figure 21:
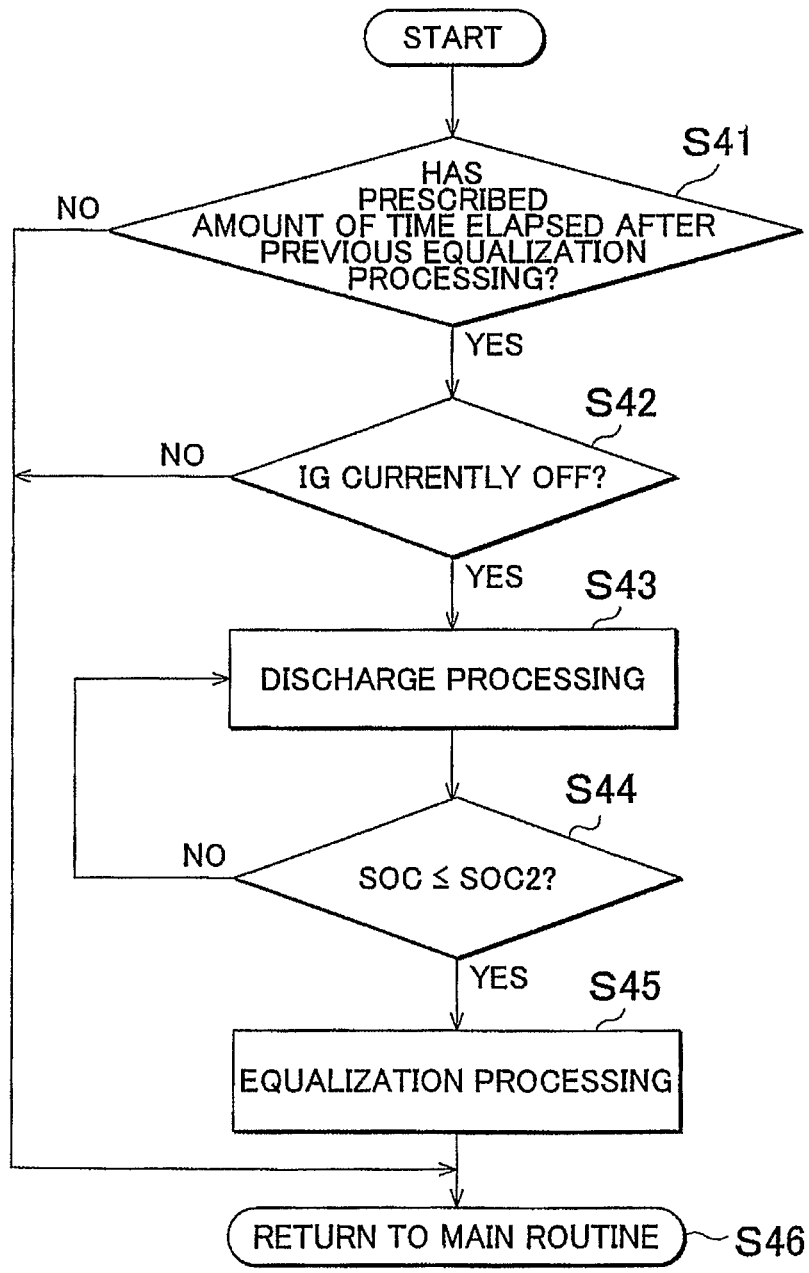
FIG. 21 is a flow chart showing control for executing discharge processing explained in FIGS. 18 to 20.

FIG. 21 is a flow chart showing control for executing discharge processing as explained in FIGS. 18 to 20. The processing of this flow chart is executed by being recalled from the main routine of vehicle control at fixed time intervals or whenever prescribed conditions are satisfied.

With reference to FIG. 21, when processing is first started, a determination is made in Step S41 as to whether or not a prescribed amount of time has elapsed after executing the previous equalization processing.

Processing proceeds to Step S46 if the prescribed amount of time has still not elapsed in Step S41. On the other hand, processing proceeds to Step S42 in the case the prescribed amount of time has elapsed in Step S41.

In Step S42, a determination is made as to whether or not the IG is off. Processing proceeds to Step S43 in the case the IG is off in Step S42. On the other hand, processing proceeds to Step S46 in the case the IG is not off in Step S42.

Battery discharge processing is executed in Step S43. Battery discharge processing is carried out by, for example, temporarily connecting a discharge resistance such as a relay between the battery cathode and anode. In addition, discharge may also be carried out by using the inverter 14 so that d-axis current flows to the stator coil of the motor generator.

In Step S44, a determination is made as to whether or not the SOC has become equal to or less than the value of SOC2. Furthermore, the value of SOC2 is a value that is 30% or less. In this region, SOC can be determined corresponding to OCV since OCV has a slope (region A3 in FIG. 3). Estimation of SOC during this time uses an estimation method based on current integration in the case the estimated value is present in region A2 of FIG. 3, and after the estimated value has moved to region A3, an estimation method is used based on an internal reaction model that uses voltage. The discharge processing of Step S43 is then carried out if the SOC is not equal to or less than SOC2 in Step S44.

In the case the SOC has become equal to or less than the value of SOC2 in Step S44, processing proceeds to Step S45 and equalization processing is carried out as explained using FIGS. 12 and 13, after which processing proceeds to Step S46. In Step S46, control is again returned to the main routine.

Figure 22:
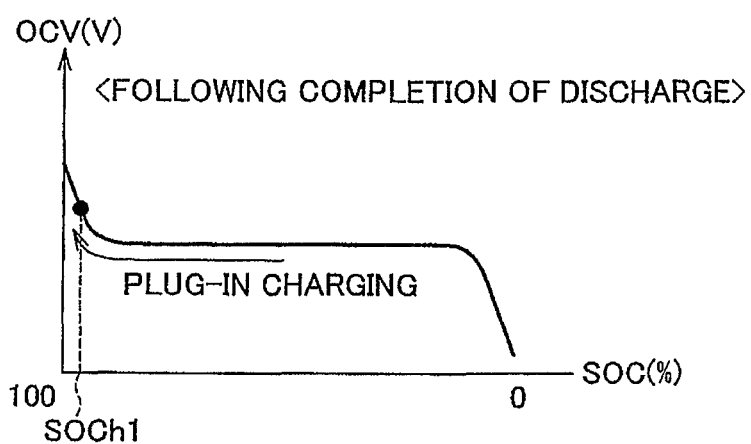
FIG. 22 is a first drawing for explaining equalization processing during plug-in charging.

FIG. 22 is a first drawing for explaining equalization processing during plug-in charging.

Figure 23:
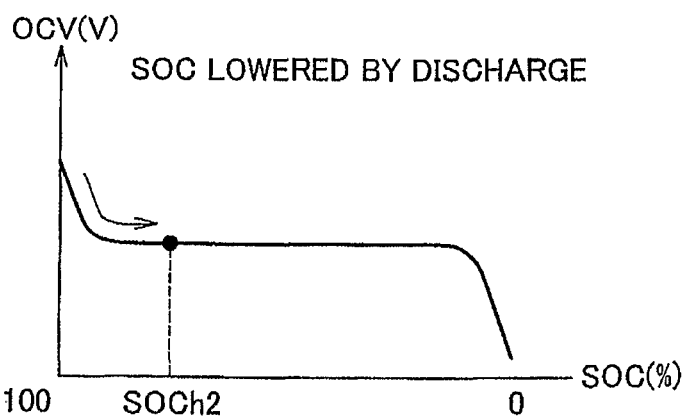
FIG. 23 is a second drawing for explaining equalization processing during plug-in charging.

FIG. 23 is a second drawing for explaining equalization processing during plug-in charging. Here, an explanation is provided of a technique for canceling variations in SOC that occur among battery cells or battery units during plug-in charging when assuming the use of an olivine iron-based battery pack in an EV or PHV.

As explained in FIG. 3, olivine iron-based batteries have a long plateau region, and in this region, SOC remains roughly constant even though OCV changes. Consequently, during charging in the plateau region (region in which SOC ranges from 30% to 95% in an example of a battery that uses a carbon-based material for the anode), it is difficult to detect SOC if variations occur in the SOC among battery cells or battery units.

Therefore, in the case of carrying out plug-in charging from the outside as shown in FIG. 22, charging is not carried out until the high SOC region as indicated by region A1 of FIG. 3 thereby preventing discrepancies in estimation of SOC. More specifically, charging is carried out until a region in which OCV has a slope (such as a region in which SOC>95%) after which charging is discontinued.

The voltages of all battery cells or battery units are detected, and equalization processing is carried out until the voltages of all of the battery cells or battery units have the same value. In the case of carrying out equalization processing, discharge processing may be carried out on the battery cells or battery units by using an equalization circuit as shown in FIG. 12 so that the voltages of all of the battery cells or battery units match the voltage of the battery cell or battery unit having the lowest voltage. Alternatively, equalization may also be carried out by transferring energy from battery cells or battery units having high voltage to battery cells or battery units having low voltage.

At this time, there is the risk of accelerated deterioration of the lithium ion battery if the SOC is maintained at a high level. At this time, as shown in FIG. 23, a prescribed amount of discharge is carried out by current integration using a resistor and the like to lower the SOC. Lowering the SOC to a region in which deterioration does not present a problem makes it possible to prevent accelerated battery deterioration. In addition, the integrated amount of current values may be used to measure the amount of electric charge when lowering the SOC. Since error attributable to current integration has hardly any effect in the case of this short-term discharge, there is little concern over discrepancies in SOC estimated values.

Figure 24:
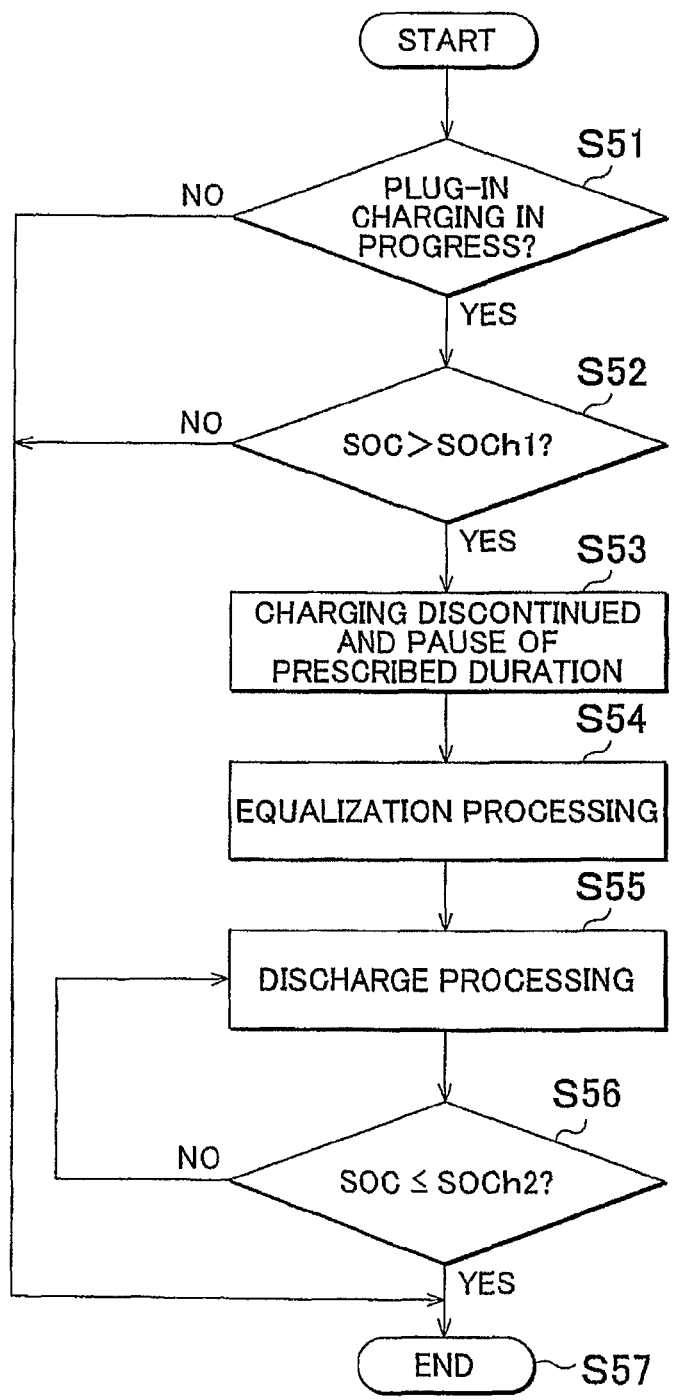
FIG. 24 is a flow chart for explaining processing in the case of executing plug-in charging.

FIG. 24 is a flow chart for explaining processing in the case of executing plug-in charging. The processing of this flow chart is executed by being recalled from a main routine of vehicle control at fixed time intervals or whenever prescribed conditions are satisfied.

With reference to FIG. 24, a determination is first made in Step S51 as to whether or not plug-in charging is in progress. Processing proceeds to Step S57 if plug-in charging is not determined to be in progress in Step S51. On the other hand, processing proceeds to Step S52 if plug-in charging is determined to be in progress in Step S51.

In Step S52, a determination is made as to whether or not the SOC has exceeded a criterion value SOCh1 during plug-in charging. Here, the criterion value SOCh1 is a criterion value for indicating that the SOC has entered a region in which OCV has a slope and which enables determination of the SOC by measuring OCV as shown in FIG. 22. For example, the criterion value SOCh1 is set to a value greater than 95%.

In the case the condition SOC>SOCh1 is not satisfied in Step S52, processing proceeds to Step S57. On the other hand, processing proceeds to Step S53 in the case the condition SOC>SOCh1 is satisfied in Step S52.

In Step S53, plug-in charging is discontinued and a pause of a prescribed duration is carried out. Subsequently, equalization processing is carried out in the following Step S54. During this equalization processing, control is carried out so that the SOC of each battery cell or battery unit is aligned based on the OCV.

Continuing, discharging processing for lowering the SOC is carried out in Step S55 to inhibit deterioration of the battery while the SOC is at a high level. This discharge processing can be carried out by temporarily connecting a discharge resistance such as a relay between the battery electrodes or by allowing a d-axis current to flow to the stator coil of the motor.

Continuing, a determination is made in Step S56 as to whether or not the SOC is equal to or less than a criterion value SOCh2. The criterion value SOCh2 is a value that is smaller than the criterion value SOCh1. The criterion value SOCh2 is set to, for example, 80% to inhibit deterioration of the battery caused by the SOC being maintained at a high level.

In the case the SOC is not yet equal to or less than the criterion value SOCh2 as shown in FIG. 23 in Step S56, processing returns to Step S55 and discharge processing is continued. On the other hand, in the case the condition of SOC≤SOCh2 is satisfied in Step S56, processing proceeds to Step S57 and charging ends.

Here, an explanation is provided of a technology for estimating SOC and battery deterioration in the case operating only in a plateau region (region in which SOC ranges from, for example, 30% to 95%) using an olivine iron-based battery pack.

Figure 25:
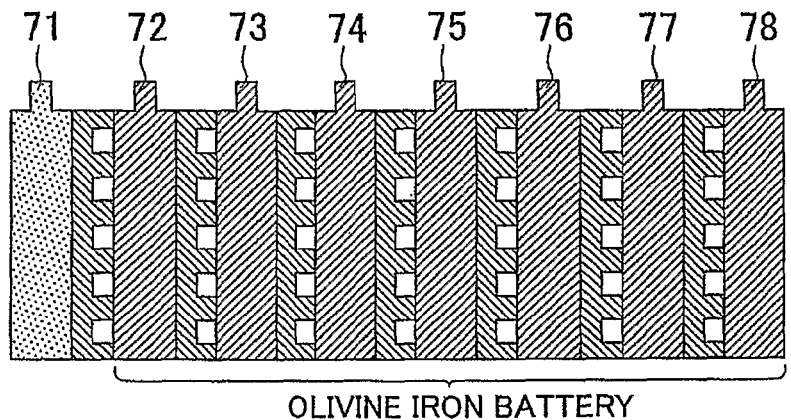
FIG. 25 is a drawing for explaining an example of using different types of battery cells incorporated in a battery pack.
Figure 26:
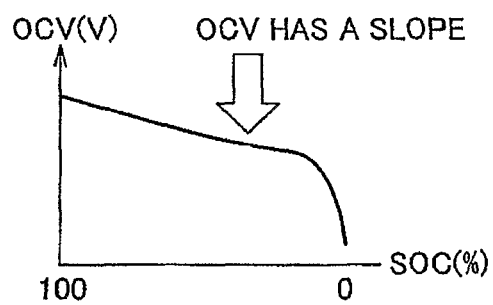
FIG. 26 is a drawing showing an SOC-OCV curve of a battery that exhibits characteristics having a slope.

FIG. 25 is a drawing for explaining an example of using different types of battery cells incorporated in a battery pack.

With reference to FIG. 25, a battery cell 71 is a battery cell of a lithium ion battery that uses a nickel-based or cobalt-based active material for which OCV has a slope. Battery cells 72 to 7S are battery cells of an olivine iron-based battery.

Figure 27:
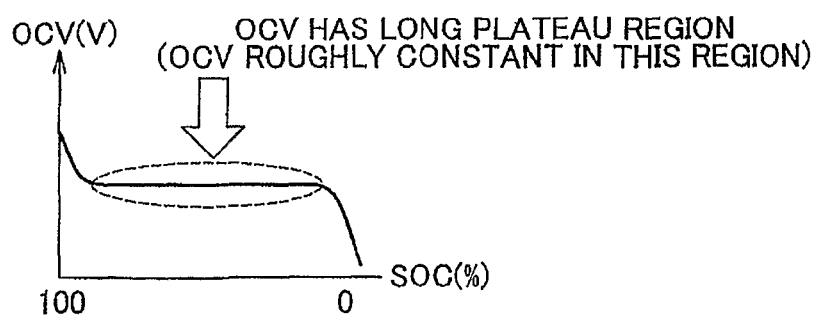
FIG. 27 is a drawing showing an SOC-OCV curve of an olivine battery.

As was explained in FIG. 27, since it is difficult to estimate SOC in a plateau region, it is necessary to rely on current integration to estimate SOC in this case. However, integration error is accumulated if current integration is carried out for a long period of time, and as a result, there is the risk of a decrease in accuracy of SOC estimated values.

Therefore, as shown in FIG. 25, at least one different type of battery cell 71 in an assembled battery, such as a lithium ion battery that uses a nickel-based or cobalt-based active material, is connected in series. The example of FIG. 25 shows an assembled battery in which 8 cells are connected in series. The different type of battery cell 71 is a battery cell of a type that does not have a plateau region and enables SOC to be determined relative to OCV. By estimating the amount of change in SOC of this battery cell by using a method based on an internal reaction model that uses voltage and converting to an olivine iron-based battery, the technology for estimating SOC and battery deterioration can be applied even in the case the states of the other battery cells 72 to 78 are in a plateau region. Namely, the battery cell in which OCV has a slope fulfills the role of an energy supply in the form of a battery as well as a type of sensor for estimating SOC.

Here, the amount of change in SOC of the olivine iron-based battery can be calculated using the following equation: $\Delta SOCo = \Delta SOCref \times (Qref/Qo)$, wherein $\Delta SOCo$ indicates the amount of change in SOC of an olivine iron-based battery connected in series, $\Delta SOCref$ indicates the amount of change in SOC of a battery cell used to estimate SOC, $Qref$ indicates the capacity of the battery cell used to estimate SOC, and $Qo$ indicates the capacity of an olivine iron-based battery connected in series.

The amount of SOC change $\Delta SOC$ of an olivine iron-based battery can be determined by substituting the value of $\Delta SOCref$ estimated with an estimation method using a battery reaction model into this equation.

Finally, the main contents of this embodiment are summarized with reference to the drawings. Again returning to FIG. 1, the vehicle 1 includes the battery B and the motor (motor generator MG2) that drives by receiving electrical power from the battery B. As shown in FIG. 3, characteristics of changes in the OCV relative to the SOC of the battery B include a first region in which the amount of change in OCV relative to the amount of change in SOC exceeds a threshold value (region A1 or A3), and a second region in which the amount of change in OCV relative to the amount of change in SOC does not exceed a threshold value (region A2: plateau region). This threshold value is set based on whether or not SOC can be uniquely determined relative to OCV. The control apparatus 30 updates estimated values of the SOC of the battery B by estimating the SOC according to a first estimation method that uses the voltage VB of the battery B (estimation method according to an internal reaction model) in the case an estimated value of the SOC of the battery B falls within the first region (region A1 or A3), and updates estimated values of the SOC of the battery B by estimating the SOC according to a second estimation method that uses current input and output to and from the battery B (estimation method according to current integration) in the case an estimated value of the SOC of the battery B falls within the second region (region A2: plateau region). In the case the period during which an estimated value of the SOC of the battery B falls within the second region (region A2: plateau region) exceeds a prescribed amount of time, the controller apparatus 30 estimates the SOC with the first estimation method (estimation method according to an internal reaction model) by temporarily changing the SOC of the battery B so that the SOC of the battery B falls within the first region (region A1 or A3).

By estimating SOC in this manner, SOC is measured accurately without causing an increase in SOC estimation error even in the case of a battery having a plateau region.

Preferably, the estimation accuracy of SOC obtained according to the first estimation method (estimation method according to an internal reaction model) is higher than the estimation accuracy of SOC obtained according to the second estimation method (estimation method according to current integration).

As shown in FIG. 12, the battery B preferably includes the plurality of battery units BU1 to BU4, and the equalization circuit 60 that equalizes the SOC of the plurality of battery units BU1 to BU4. The control apparatus 30 estimates SOC according to the first estimation method (estimation method according to an internal reaction model) by temporarily changing the SOC of the battery B so that the SOC of the battery B falls within the first region (A1 or A3 in FIG. 3) prior to activating the equalization circuit 60 and equalizing the SOC of the plurality of battery units BU1 to BU4.

More preferably, the vehicle 1 further includes an internal combustion engine (engine 40) and a generator (motor generator MG1) that generates electricity by using motive power of the internal combustion engine (engine 40). The control apparatus 30 changes the SOC of the battery B by changing the amount of electrical power consumed by the motor (motor generator MG2) and the amount of electricity generated by the generator (motor generator MG1).

Preferably, the vehicle 1 as shown in FIG. 1 is composed so as to allow external charging in which the battery B is charged by receiving electrical power provided from an external charging apparatus 100 outside the vehicle. The first region is a region in which the SOC is higher than that of the second region. In addition to externally charging the battery B until the SOC of the battery B reaches the first region as shown in FIG. 22, the control apparatus 30 discharges the battery B by a prescribed amount as shown in FIG. 23 after having estimated the SOC of the battery B according to the first estimation method.

Preferably, as shown in FIG. 2, the control apparatus 30 is provided with the battery control unit 31, which in addition to calculating an estimated value of the SOC of the battery B using either the first or second estimation method, outputs a control target value of the SOC based on an estimated value of the SOC of the battery B, and the HV control unit 32, which changes the SOC of the battery B by controlling the motor and the generator (motor generators MG1 and MG2) based on the estimated value of the SOC of the battery B and a control target value SOC*.

Furthermore, this embodiment has shown an example of applying the invention to a series/parallel hybrid system capable of dividing transfer of motive power of the engine between a vehicle axle and generator using a motive power dividing mechanism. However, the invention can also be applied a series HV, which uses only an engine to drive the generator and generates motive power of the vehicle axle with only a motor that uses electrical power generated by a generator, or the invention can be applied to an EV that is operated with a motor only. The invention can be applied to either of these configurations since they both require estimation of battery SOC.

In addition, although this embodiment uses the example of numerical values of an olivine iron-based lithium ion battery that uses a carbon-based material for the anode to describe OCV and SOC of the plateau region, these numerical values are merely intended to be exemplary, and these numerical values can be suitably changed in the case of application of the invention to other batteries having a plateau region.

While the invention has been described with reference to example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A control apparatus for a vehicle, wherein
the vehicle includes a battery and a motor that drives by receiving electrical power from the battery, and
characteristics of changes in open circuit voltage relative to a status of charge of the battery include a first region in which an amount of change in the open circuit voltage relative to an amount of change in the status of charge exceeds a threshold value, and a second region in which the amount of change in the open circuit voltage relative to the amount of change in the status of charge does not exceed the threshold value,
the control apparatus comprising:
a first estimation unit that, in the case an estimated value of the status of charge of the battery falls within the first region, updates the estimated value of the status of charge of the battery by estimating the status of charge according to a first estimation method that uses the voltage of the battery;
a second estimation unit that, in the case the estimated value of the status of charge of the battery falls within the second region, updates the estimated value of the status of charge of the battery by estimating the status of charge according to a second estimation method that uses current that is input and output to and from the battery; and
a third estimation unit that, in the case a period, during which the estimated value of the status of charge of the battery falls within the second region, exceeds a prescribed period, temporarily changes the status of charge of the battery so that the status of charge of the battery falls within the first region and estimates the status of charge by the first estimation method.

2. The control apparatus according to claim 1, wherein the control apparatus sets the threshold value based on whether or not the status of charge of the battery can be uniquely determined relative to the open circuit voltage.

3. The control apparatus according to claim 1, wherein estimation accuracy of the status of charge obtained according to the first estimation method is higher than estimation accuracy of the status of charge obtained according to the second estimation method.

4. The control apparatus according to claim 1, wherein
the battery includes a plurality of cells and an equalization circuit that equalizes the status of charge of the plurality of cells, and
the control apparatus temporarily changes the status of charge of the battery so that the status of charge of the battery falls within the first region prior to equalizing the status of charge of the plurality of cells by activating the equalization circuit and estimates the status of charge by the first estimation method.

5. The control apparatus according to claim 4, wherein
the vehicle further includes an internal combustion engine and a generator that generates electricity by using motive power of the internal combustion engine, and
the control apparatus changes the status of charge of the battery by changing an amount of electrical power consumed by the motor and an amount of electricity generated by the generator.

6. The control apparatus according to claim 5, wherein
the first region is a region in which the status of charge is lower than that of the second region, and
the battery is charged by the generator after having discharged the battery until the status of charge of the battery reaches the first region and estimated the status of charge of the battery according to the first estimation method.

7. The control apparatus according to claim 1, wherein
the vehicle is configured so as to allow external charging in which the battery is charged by receiving electrical power provided from outside the vehicle,
the first region is a region in which the status of charge is higher than that of the second region, and the control apparatus discharges the battery by a prescribed amount after having externally charged the battery until the status of charge of the battery reaches the first region and estimated the status of charge of the battery according to the first estimation method.

8. The control apparatus according to claim 1, further comprising
a battery control unit that calculates an estimated value of the status of charge of the battery in use of either the first or second estimation method, and outputs a control target value of the status of charge based on the estimated value of the status of charge of the battery; and
a hybrid control unit,
wherein the vehicle further includes an internal combustion engine and a generator that generates electricity by using motive power of the internal combustion engine, and
the hybrid control unit changes the status of the charge of the battery by controlling the motor and the generator based on the estimated value of the status of charge of the battery and the control target value.

9. A vehicle control method for a vehicle having: a battery that has, as characteristics of changes in open circuit voltage relative to a status of charge, a first region in which an amount of change in the open circuit voltage relative to an amount of change in the status of charge exceeds a threshold value and a second region in which the amount of change in the open circuit voltage relative to the amount of change in the status of charge does not exceed the threshold value; and a motor that drives by receiving electrical power from the battery, the method comprising:
estimating the status of charge of the battery;
updating an estimated value of the status of charge of the battery by estimating the status of charge according to a first estimation method that uses voltage of the battery in the case the estimated value of the status of charge of the battery falls within the first region;
updating the estimated value of the status of charge of the battery by estimating the status of charge of the battery according to a second estimation method that uses current that is input and output to and from the battery in the case the estimated value of the status of charge of the battery falls within the second region; and
estimating the status of charge by the first estimation method by temporarily changing the status of the charge of the battery so that the status of charge of the battery falls within the first region in the case a period, during which the estimated value of the status of charge of the battery falls within the second region exceeds a prescribed period.

* * * * *